(12) United States Patent
Gardner et al.

(10) Patent No.: US 12,002,809 B2
(45) Date of Patent: Jun. 4, 2024

(54) METHOD TO ENHANCE 3D HORIZONTAL NANOSHEETS DEVICE PERFORMANCE

(71) Applicant: Tokyo Electron Limited, Tokyo (JP)

(72) Inventors: Mark I. Gardner, Cedar Creek, TX (US); H. Jim Fulford, Marianna, FL (US)

(73) Assignee: Tokyo Electron Limited, Tokyo (JP)

( * ) Notice: Subject to any disclaimer, the term of this patent is extended or adjusted under 35 U.S.C. 154(b) by 408 days.

(21) Appl. No.: 17/469,939

(22) Filed: Sep. 9, 2021

(65) Prior Publication Data

US 2022/0238520 A1  Jul. 28, 2022

Related U.S. Application Data

(60) Provisional application No. 63/141,557, filed on Jan. 26, 2021.

(51) Int. Cl.
*H01L 27/092* (2006.01)
*H01L 21/8238* (2006.01)
*H01L 29/06* (2006.01)
*H01L 29/423* (2006.01)
*H01L 29/786* (2006.01)

(52) U.S. Cl.
CPC .. *H01L 27/0922* (2013.01); *H01L 21/823807* (2013.01); *H01L 21/823828* (2013.01); *H01L 29/0665* (2013.01); *H01L 29/42392* (2013.01); *H01L 29/78696* (2013.01)

(58) Field of Classification Search
CPC ......... H01L 27/0922; H01L 21/823807; H01L 21/823828; H01L 29/0665; H01L 29/42392; H01L 29/78696; H01L 21/8221; H01L 27/0688; H01L 27/092; H01L 29/0673; H01L 29/66439
See application file for complete search history.

(56) References Cited

U.S. PATENT DOCUMENTS

2021/0273050 A1* 9/2021 Peng ..................... H01L 29/045

* cited by examiner

*Primary Examiner* — J. E. Schoenholtz
(74) *Attorney, Agent, or Firm* — Oblon, McClelland, Maier & Neustadt, L.L.P.

(57) ABSTRACT

Aspects of the present disclosure provide a method of fabricating a semiconductor device including a plurality of vertically stacked transistors. For example, the method can include providing a vertical stack of alternating horizontal first and second layers, the second layers forming channels of the transistors. The method can further include uncovering the second layers. The method can further include forming a first shell on a first one of the uncovered second layers, the first shell and the first one of the uncovered second layers forming a first channel structure of a first one of the transistors.

20 Claims, 15 Drawing Sheets

METHOD TO ENHANCE 3D HORIZONTAL NANOSHEETS DEVICE PERFORMANCE

INCORPORATION BY REFERENCE

This present disclosure claims the benefit of U.S. Provisional Application No. 63/141,557, "Method to Enhance 3D Horizontal Nanosheets Device Performance" filed on Jan. 26, 2021, which is incorporated herein by reference in its entirety.

FIELD OF THE PRESENT DISCLOSURE

The present disclosure relates generally to microelectronic devices including semiconductor devices, transistors, and integrated circuits, including methods of microfabrication.

BACKGROUND

In the manufacture of a semiconductor device (especially on the microscopic scale), various fabrication processes are executed such as film-forming depositions, etch mask creation, patterning, material etching and removal, and doping treatments. These processes are performed repeatedly to form desired semiconductor device elements on a substrate. Historically, with microfabrication, transistors have been created in one plane, with wiring/metallization formed above the active device plane, and have thus been characterized as two-dimensional (2D) circuits or 2D fabrication. Scaling efforts have greatly increased the number of transistors per unit area in 2D circuits, yet scaling efforts are running into greater challenges as scaling enters single digit nanometer semiconductor device fabrication nodes. Semiconductor device fabricators have expressed a desire for three-dimensional (3D) semiconductor circuits in which transistors are stacked on top of each other.

SUMMARY

Aspects of the present disclosure provide a method of fabricating a semiconductor device including a plurality of vertically stacked transistors. For example, the method can include providing a vertical stack of alternating horizontal first and second layers, the second layers forming channels of the transistors. The method can further include uncovering the second layers. The method can further include forming a first shell on a first one of the uncovered second layers, the first shell and the first one of the uncovered second layers forming a first channel structure of a first one of the transistors. In an embodiment, forming a first shell on a first one of the uncovered second layers includes forming a first shell around a first one of the uncovered second layers.

In an embodiment, forming a first shell on a first one of the uncovered second layers can include epitaxially growing a first shell on a first one of the uncovered second layers. For example, at least one of the first shell and the second layers can include an element selected from groups III, IV and V of the periodic table. As another example, at least one of the first shell and the second layers can include boron (B), carbon (C), nitrogen (N), aluminum (Al), silicon (Si), phosphorus (P), gallium (Ga), germanium (Ge), arsenic (As), indium (In), tin (Sn), antimony (Sb), or a combination thereof.

In an embodiment, the method can further include forming a second shell on a second one of the uncovered second layers, wherein the second shell and the second one of the uncovered second layers can form a second channel structure of a second one of the transistors, the first channel structure can be a P-type channel structure, and the second channel structure can be an N-type channel structure. In another embodiment, the method can further include forming a second shell on a second one of the uncovered second layers, wherein the second shell and the second one of the uncovered second layers can form a portion of a second channel structure of a second one of the transistors, and the first and second shells can include different materials.

In an embodiment, providing a vertical stack of alternating horizontal first and second layers can include epitaxially growing alternating horizontal first and second layers. In another embodiment, providing a vertical stack of alternating horizontal first and second layers can include bonding two sub-stacks of alternating horizontal first and second layers.

In an embodiment, uncovering the second layers can include removing an end portion of the first layers in a channel direction to form indents, forming spacers to fill the indents, and removing a remainder of the first layers.

In an embodiment, the method can further include forming a gate electrode around the first shell and a remainder of the second layers.

In an embodiment, the method can further include, prior to forming a first shell on a first one of the uncovered second layers, thinning a first one of the uncovered second layers, wherein forming a first shell on a first one of the uncovered second layers can include forming a first shell on the thinned first one of the uncover second layers.

Aspects of the present disclosure further provide a semiconductor device. For example, the semiconductor device can include a vertical stack of horizontal channels of a plurality of transistors. The semiconductor device can further include a first shell formed on a first one of the channels, wherein the first shell and the first one of the channels can form a first channel structure of a first one of the transistors. In an embodiment, the first shell can be formed around the first one of the channels.

In an embodiment, the first shell can include an epitaxy material. For example, at least one of the first shell and the channels can include an element selected from groups III, IV and V of the periodic table. As another example, at least one of the first shell and the channels can include B, C, N, Al, Si, P, Ga, Ge, As, In, Sn, Sb, or a combination thereof.

In an embodiment, the semiconductor device can further include a second shell formed on a second one of the channels, wherein the second shell and the second one of the channels can form a second channel structure of a second one of the transistors, the first channel structure can be a P-type channel structure, and the second channel structure can be an N-type channel structure. In another embodiment, the semiconductor device can further include a second shell formed on a second one of the channels, wherein the second shell and the second one of the channels can form a second channel structure of a second one of the transistors, and the first and second shells can include different materials.

In an embodiment, the semiconductor device can further include a gate electrode formed around the first shell and a remainder of the channels.

Of course, the order of discussion of the different steps as described herein has been presented for clarity sake. In general, these steps can be performed in any suitable order. Additionally, although each of the different features, techniques, configurations, etc. herein may be discussed in different places of this disclosure, it is intended that each of the concepts can be executed independently of each other or in combination with each other. Accordingly, the present disclosure can be embodied and viewed in many different ways.

Note that this summary section does not specify every embodiment and/or incrementally novel aspect of the present disclosure or claimed disclosure. Instead, this summary only provides a preliminary discussion of different embodiments and corresponding points of novelty over conventional techniques. For additional details and/or possible perspectives of the present disclosure and embodiments, the reader is directed to the Detailed Description section and corresponding figures of the present disclosure as further discussed below.

BRIEF DESCRIPTION OF THE DRAWINGS

Various embodiments of this disclosure that are proposed as examples will be described in detail with reference to the following figures, wherein like numerals reference like elements, and wherein.

DETAILED DESCRIPTION 3D integration, i.e., the vertical stacking of multiple devices, aims to overcome scaling limitations experienced in planar devices by increasing transistor density in volume rather than area. Although device stacking has been successfully demonstrated and implemented by the flash memory industry with the adoption of 3D NAND, application to random logic designs is substantially more difficult. 3D integration for logic chips (CPU (central processing unit), GPU (graphics processing unit), FPGA (field programmable gate array), SoC (System on a chip)) is being pursued.

Techniques herein include forming lateral gate-all-around (GAA) channel transistors with shells grown by epitaxy. By starting with a common semiconductor core for 3D transistors, a single-crystal shell of epi (or stack of epi shells) is selectively grown vertically thereby creating an optimum material channel formation. This technique provides a significant mobility boost because material type is optimized for NMOS and PMOS devices. Examples described herein can include vertical stacks of two to four transistors, but techniques herein can be extended to N transistor tall. Embodiments can be applied to both 3D side-by-side CMOS and also complementary FET (CFET) CMOS designs. Also combinations of side-by-side and CFET are also contemplated herein. Techniques provide for separate control of NMOS and PMOS gate electrode, channel, and gate dielectric for all combinations. Embodiments can enable a dual channel release option for PMOS and NMOS for both side-by-side and stacked CMOS devices to provide separate optimum epitaxial solutions starting from a common core epi. Both epi selective shells and EPI cores herein can use some elements as options to cover the device needs for high performance 3D nanosheets with optimum mobility.

Figure 1:
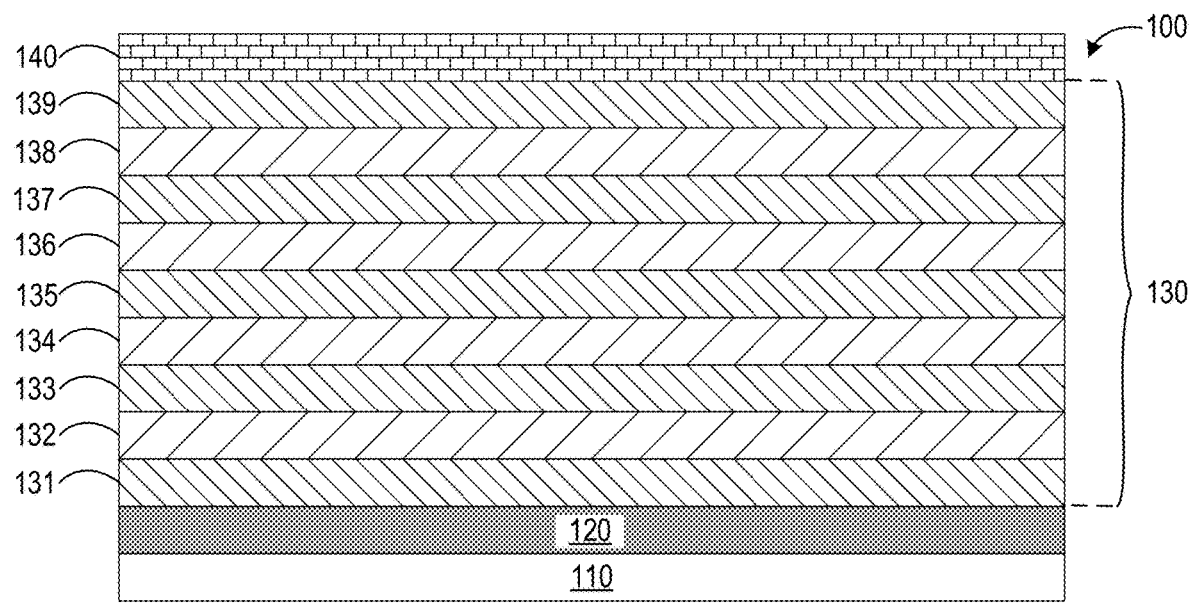
FIGS. 1-8 illustrate a first exemplary method for fabricating a first semiconductor device 100 according to some embodiments of the present disclosure.

FIGS. 1-8 illustrate a first exemplary method for fabricating a first semiconductor device 100 according to some embodiments of the present disclosure. As shown in FIG. 1, the first semiconductor device 100 can include a substrate 110, a dielectric layer 120 formed on the substrate 110, a stack 130 of alternating layers 131-139 stacked on the dielectric layer 120, and a cap layer 140 formed on the stack 130 of alternating layers 131-139. For example, the substrate 110 can be a silicon substrate or a silicon-on-insulator (SOI) substrate (or a silicon/dielectric/silicon substrate). As another example, the cap layer 140 can include a hardmask material. In an embodiment, the stack 130 of alternating layers 131-139 can be a nanosheet stack 130 of alternating semiconductor layers 131-139. For example, the layers 131-139 can be epitaxially grown on the dielectric layer 120 or the substrate 110 sequentially. In an embodiment, the layers 131-139 can include an element selected from groups III, IV and V of the periodic table, such as boron (B), carbon (C), nitrogen (N), aluminum (Al), silicon (Si), phosphorus (P), gallium (Ga), germanium (Ge), arsenic (As), indium (In), tin (Sn), antimony (Sb), or a combination thereof, such as $Si_xC_y$ (e.g., SiC), $Si_xGe_y$ (e.g., SiGe), GeSn (e.g., GeSn), GeC, SnC, SiSn, SiAs, SiP, SiSb, SiIn, SiGa, SiB, SiGaB, GeAs, GeP, GeSb, GeIn, GeB, SiCAs, SiCP, SiCAs, SiCSb, SiCIn, SiCB, GaAs, InP, GaP, GaN, and InGaAs, and $Ge_xSn_y$ with in-situ doping of As, P, Sb, In, Ga or B, which can be, for example, doped in-situ into the layers 131-139. For example, the layers 131, 133, 135, 137 and 139 can include SiGe, and the layers 132, 134, 136 and 138 can include Si or Ge.

Figure 2:
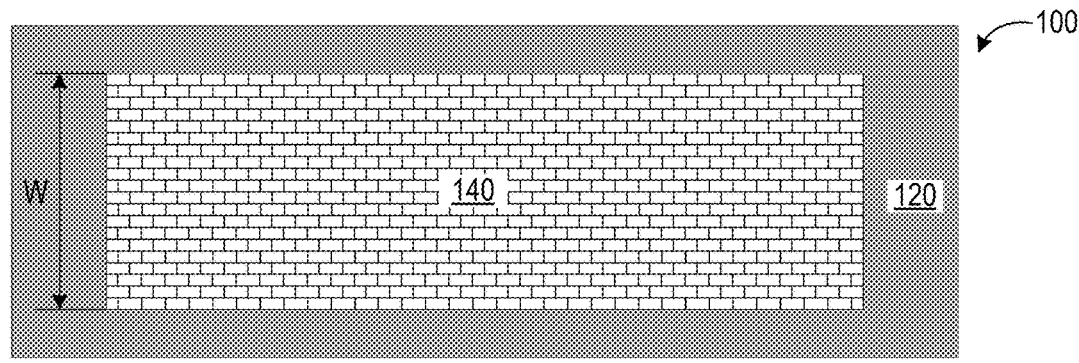

As shown in FIG. 2, which is a top view of the first semiconductor device 100, the first semiconductor device 100 can be etched to define a width W of the first semiconductor device 100. For example, a photoresist (e.g., positive) layer can be applied onto the first semiconductor device 100, a photomask can be provided to cover a portion of the photoresist layer, the photoresist layer that is not covered by the photomask can be exposed to light and be developed and removed, a portion of the first semiconductor device 100 that is not covered by the remainder of the photoresist layer (or referred to as an etch mask) can be etched, stopping at the dielectric layer 120, to define the width W of the first semiconductor device 100, and the etch mask can be stripped.

Figure 3:
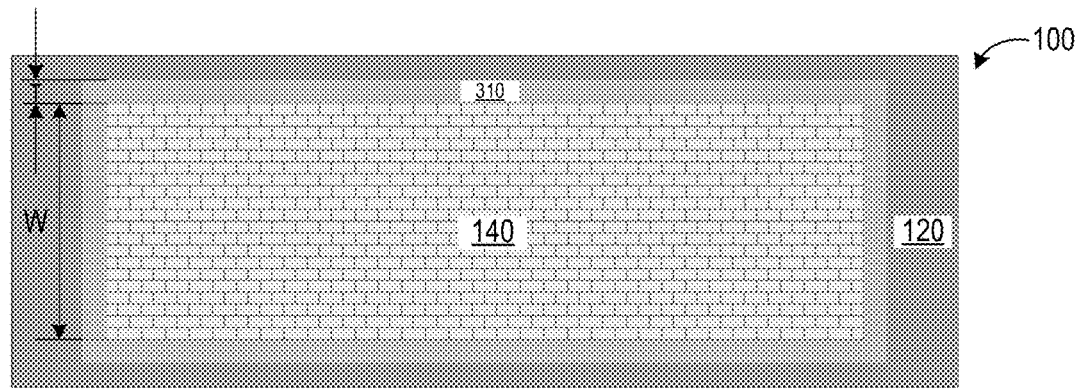

As shown in FIG. 3, which is a top view of the first semiconductor device 100, a dielectric deposition can be followed by a dummy gate 310 deposition. In an embodiment, the entire width W of the nanosheet stack 130 can be encapsulated with the dummy gate 310. For example, the dummy gate 310 can be a dummy stack of oxide/poly/nitride and have a thickness T.

Figure 4:
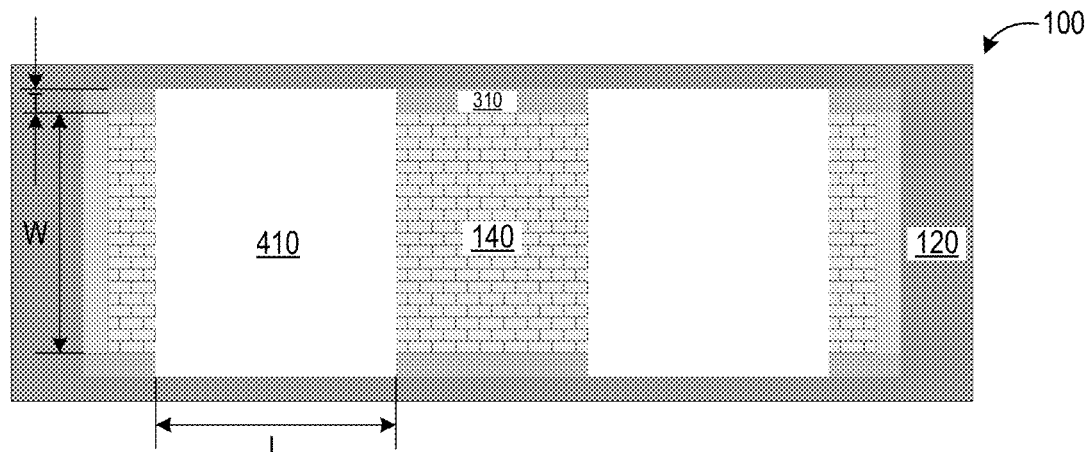

As shown in FIG. 4, which is a top view of the first semiconductor device 100, the first semiconductor device 100 can be further etched to define a length L of the first semiconductor device 100. For example, an etch mask 410 having a width of W plus 2×T and a length L can be formed to cover a portion of the first semiconductor device 100, and the remainder of the first semiconductor device 100 can be etched, stopping at the dielectric layer 120, to define the length L of the first semiconductor device 100.

Figure 5:
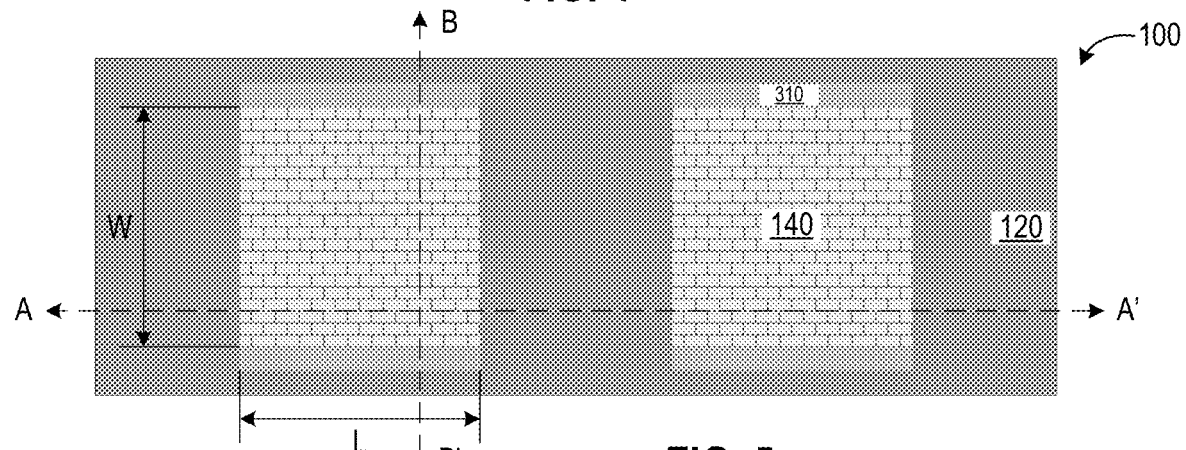
Figure 5A:
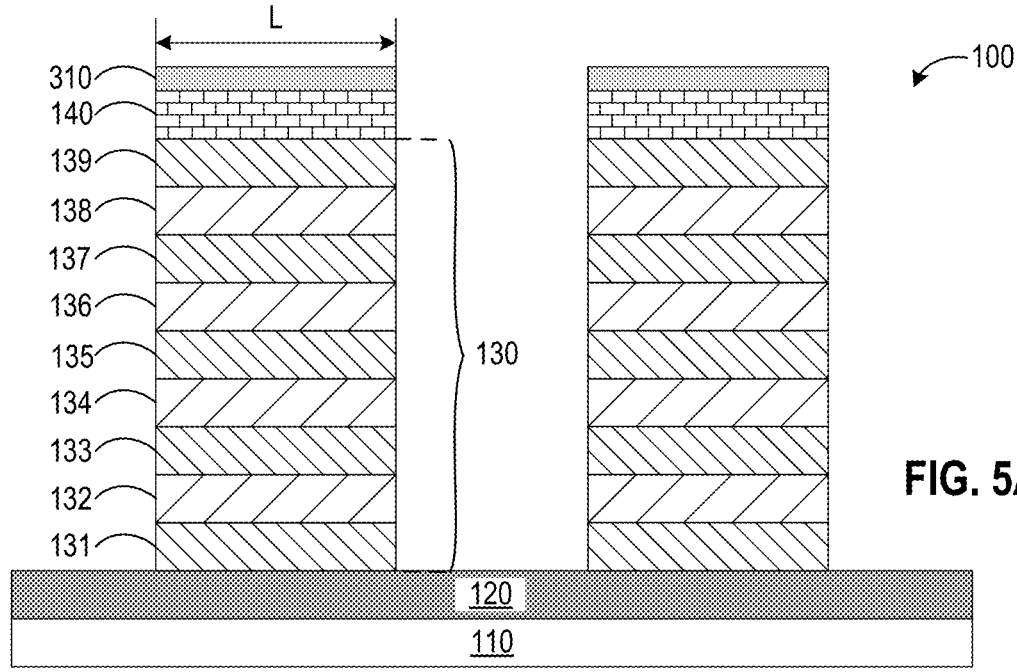
Figure 5B:
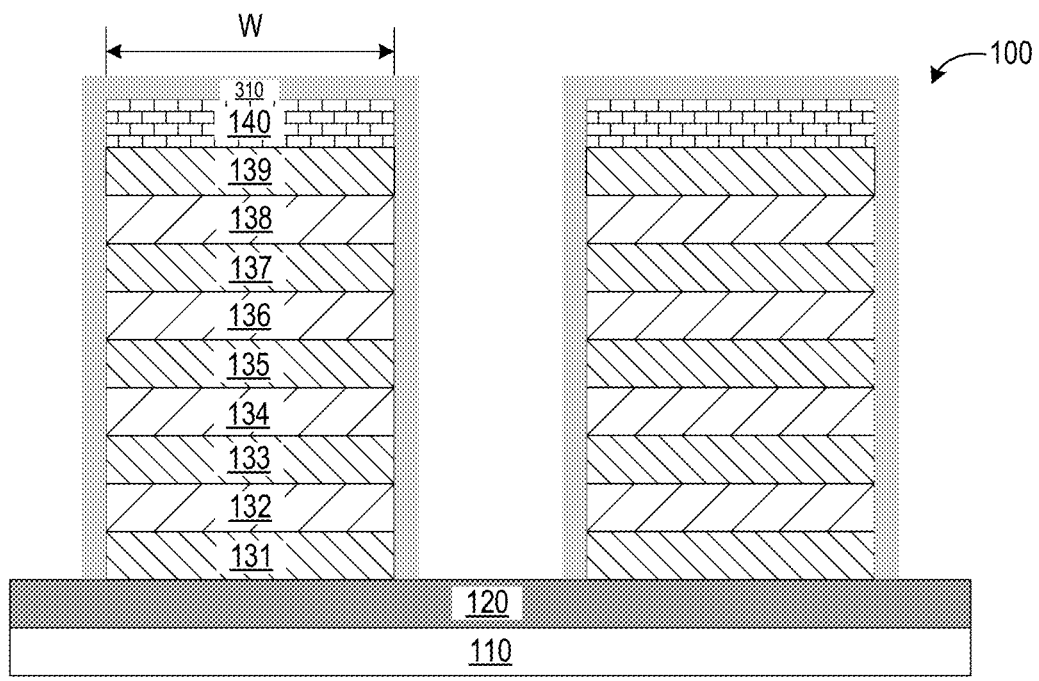

As shown in FIG. 5, which is a top view of the first semiconductor device 100, the etch mask 410 can be removed, and beneath the cap layer 140 can be formed the nanosheet stack 130 with the dummy gate 310 covering the top and widthwise surfaces thereof. FIG. 5A is a cross-sectional view of the first semiconductor device 100 through a line AA' of FIG. 5. FIG. 5B is a cross-sectional view of the first semiconductor device 100 through a line BB' of FIG. 5.

Figure 6:
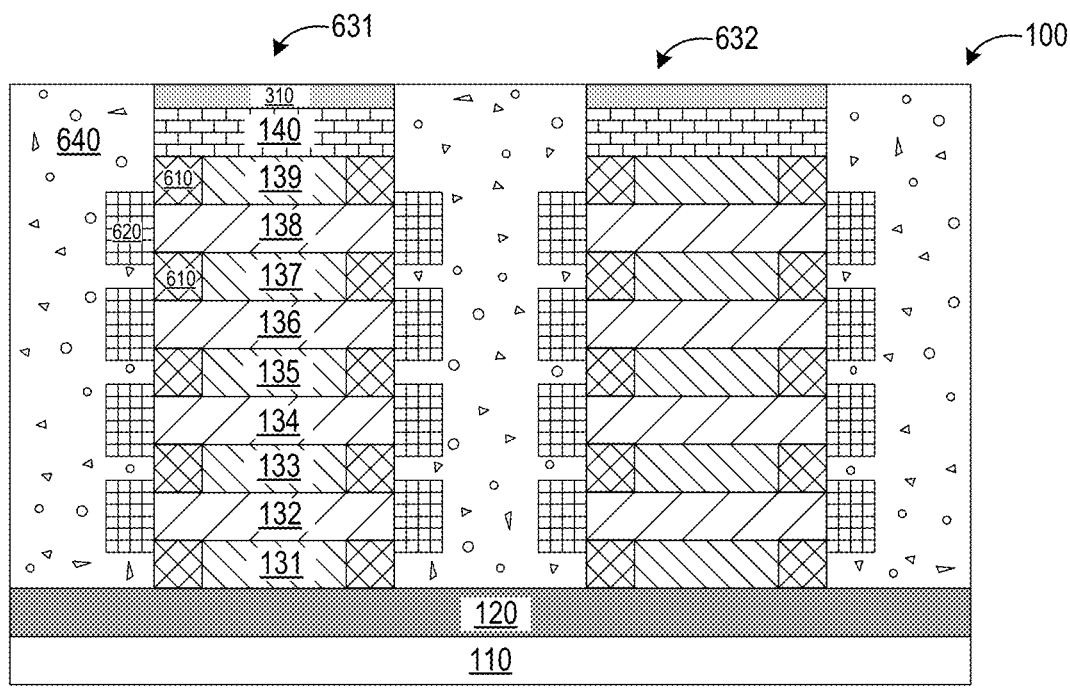

As shown in FIG. 6, which follows FIG. 5A, indent etch (e.g., SiGe indent etch) can be followed by dielectric deposition and etch forming dielectric spacers (or, more simply, spacers) 610. For example, an end portion of the (e.g., SiGe) layers 131, 133, 135, 137 and 139 in a length or channel direction can be etched to define indents, and a dielectric material can fill the indents and be planarized via, for example, etching, to form dielectric spacers 610. In an embodiment, the dielectric spacers 610 can provide support once the (SiGe) layers 131, 133, 135, 137 and 139 are removed. FIG. 6 further shows that a P+ (or N−) material can be formed (e.g., epitaxially grown) from an end portion of the (e.g., Si or Ge) layers 132, 134, 136 and 136 in the channel direction to form P+ (or N−) source/drains (S/Ds) 620 of PMOS (or NMOS) devices 631 and 632. FIG. 6 further shows that a dielectric material 640 can be deposited to encapsulate the PMOS (or NMOS) devices 631 and 632, and be planarized via, for example, CMP.

Figure 7:
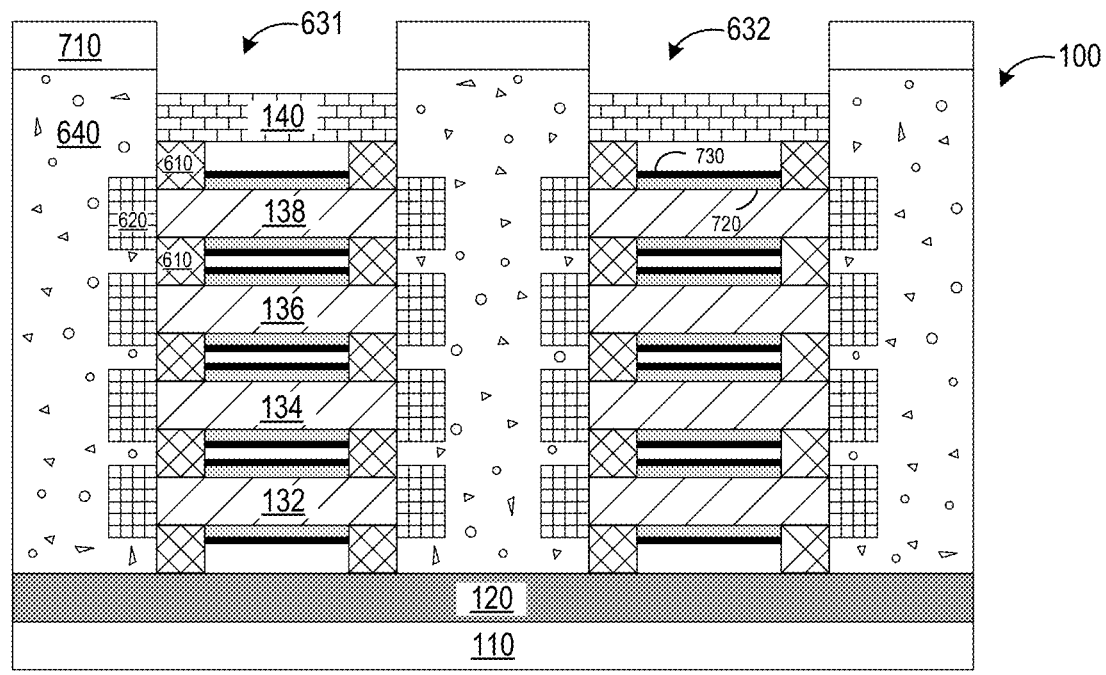

As shown in FIG. 7, an etch mask 710 can be formed to cover the P+(or N−) S/Ds 620 of the PMOS (or NMOS) devices 631 and 632, and a directional etch in a width direction can be performed to remove the dummy gate 310 followed by the (SiGe) layers 131, 133, 135, 137 and 139 of the nanosheet stack 130 to uncover the layers 132, 134, 136 and 138. Optionally, the uncovered (Si or Ge) layers 132, 134, 136 and 138, which act as the channels of the PMOS (or NMOS) devices 631 and 632, can be thinned prior to (e.g., SiGe or Ge) epitaxial growth thereon depending on device design considerations. FIG. 7 further shows that a shell (or referred to as a graded epitaxial shell) 720 or covering of an epitaxy material, for example, can be formed (e.g., epitaxially grown) on (or around) each of the (e.g., Si or Ge) layers 132, 134, 136 and 138 to enhance the performance of the PMOS (or NMOS) devices 631 and 632. For example, the epitaxy material can include elements selected from groups III, IV and V of the periodic table, such as B, C, N, Al, Si, P, Ga, Ge, As, In, Sn, Sb, and a combination thereof, such as $Si_xC_y$ (e.g., SiC), $Si_xGe_y$ (e.g., SiGe), GeSn (e.g., GeSn), GeC, SnC, SiSn, SiAs, SiP, SiSb, SiIn, SiGa, SiB, SiGaB, GeAs, GeP, GeSb, GeIn, GeB, SiCAs, SiCP, SiCAs, SiCSb, SiCIn, SiCB, GaAs, InP, GaP, GaN and InGaAs, and $Ge_xSn_y$ with in-situ doping of As, P, Sb, In, Ga or B. As another example, the (graded epitaxial) shells 720/the layers (or referred to as epi cores) 132, 134, 136 and 138 can include $Si+Si_xGe_y/Ge$, $Si_xGe_y/Si$, $Si/SiC$, $Ge/Ge_xSn_y$, $Si+Si_xGe_y/GaB$, or $Si+Si_xGe_y/GaN$. FIG. 7 further shows a high-K dielectric material deposition followed by a gate electrode metal stack 730 on (or around) each of the shells 720 (i.e., a channel structure) of the PMOS (or NMOS) devices 631 and 632.

Figure 8:
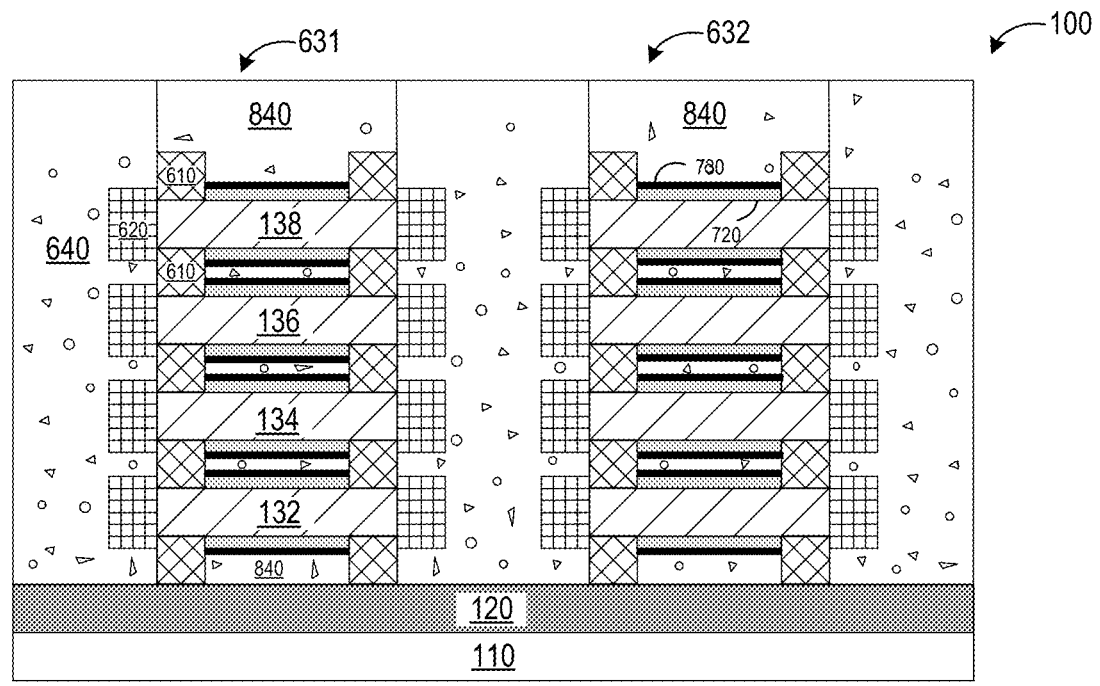

As shown in FIG. 8, the etch mask 710 and the cap layer 140 can be etched and removed via, for example, CMP, and a dielectric material 840 can be deposited to fill openings to isolate the completed PMOS (or NMOS) devices 631 and 632, which have the same type and are disposed side-by-side and each of which has four PMOS (or NMOS) transistors vertically stacked on each other. In an embodiment, each of the PMOS (or NMOS) devices 631 and 632 can have two or any number of vertically stacked PMOS (or NMOS) transistors.

Figure 9:
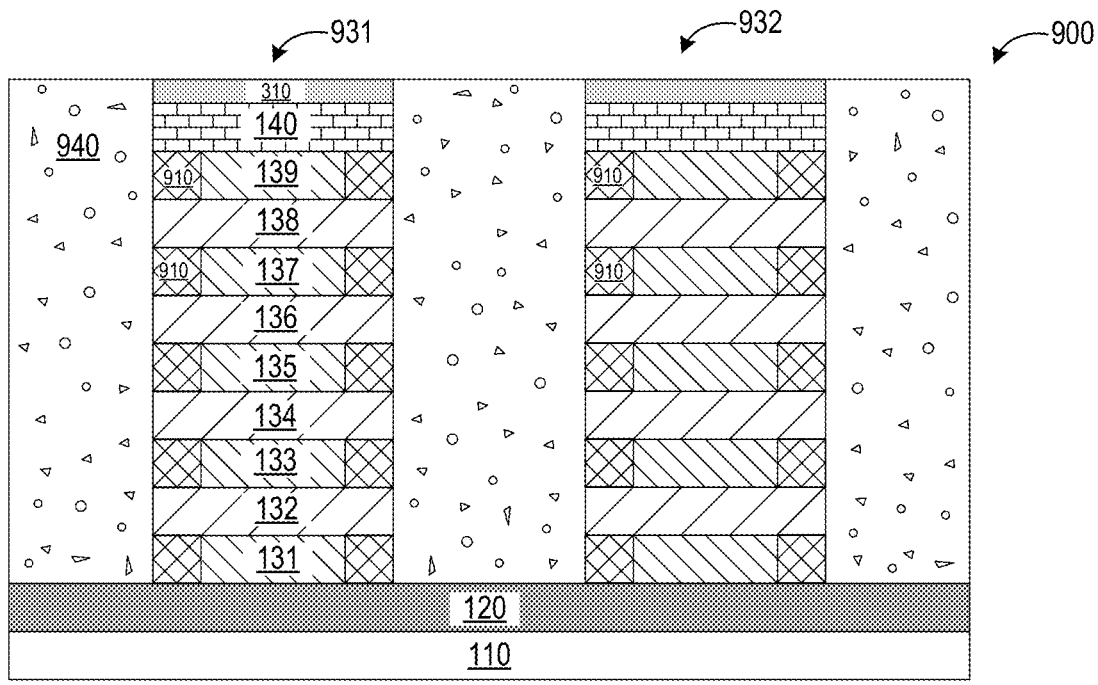
FIGS. 9-15 illustrate a second exemplary method for fabricating a second semiconductor device according to some embodiments of the present disclosure.

FIGS. 9-15 illustrate a second exemplary method for fabricating a second semiconductor device 900 according to some embodiments of the present disclosure. The second semiconductor device 900 differs from the first semiconductor device 100 at least in that the second semiconductor device 900 can include two MOS devices that have different types, i.e., one is PMOS device and the other is NMOS device. As shown in FIG. 9, which follows FIG. 5A, indent etch (e.g., SiGe indent etch) can be followed by dielectric deposition and etch forming dielectric spacers. For example, an end portion of the (e.g., SiGe) layers 131, 133, 135, 137 and 139 can be etched in the channel direction to define indents, and a dielectric material can fill the indents and be planarized via etching to form dielectric spacers 910. In an embodiment, the dielectric spacers 910 can provide support once the (SiGe) layers 131, 133, 135, 137 and 139 are removed. FIG. 9 further shows that a dielectric material 940 can be deposited to encapsulate an NMOS device 931 and a PMOS device 932, and be planarized via, for example, CMP.

Figure 10:
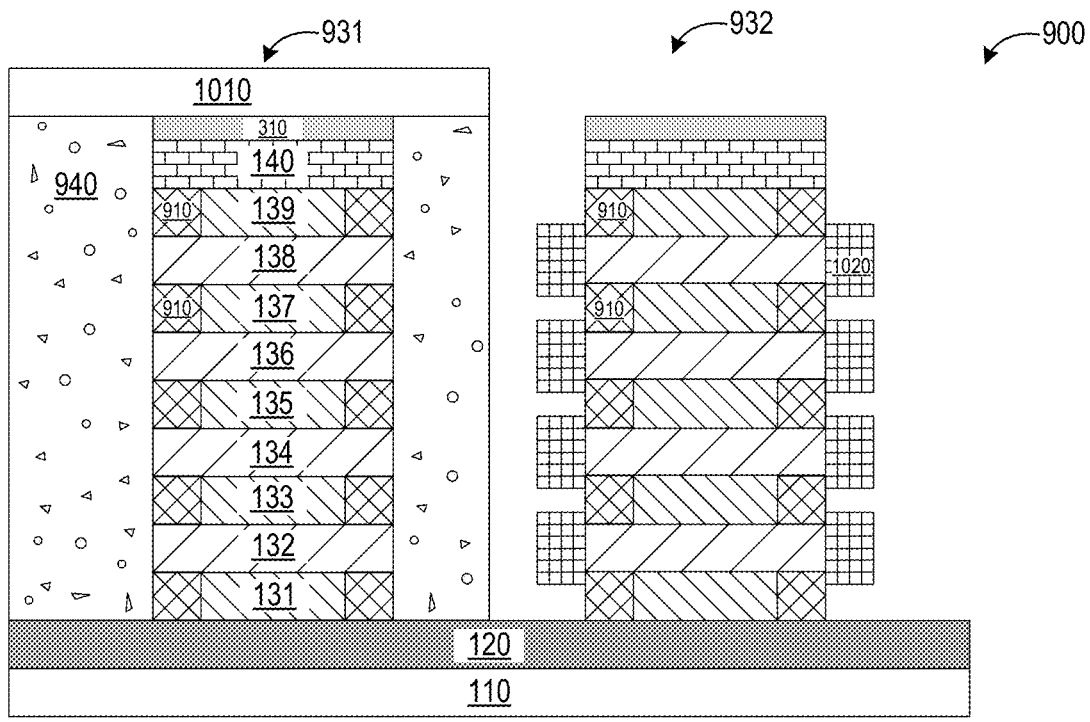

As shown in FIG. 10, an etch mask 1010 can be formed to cover the NMOS device 931, and a portion of the dielectric material 940 that encapsulates the PMOS device 932 and is not covered by the etch mask 1010 can be etched to uncover the PMOS device 932. FIG. 10 further shows that a P+ material can be formed (e.g., epitaxially grown) from an end portion of the (e.g., Si or Ge) layers 132, 134, 136 and 136 of the PMOS device 932 to form P+ S/Ds 1020 of the PMOS device 932.

Figure 11:
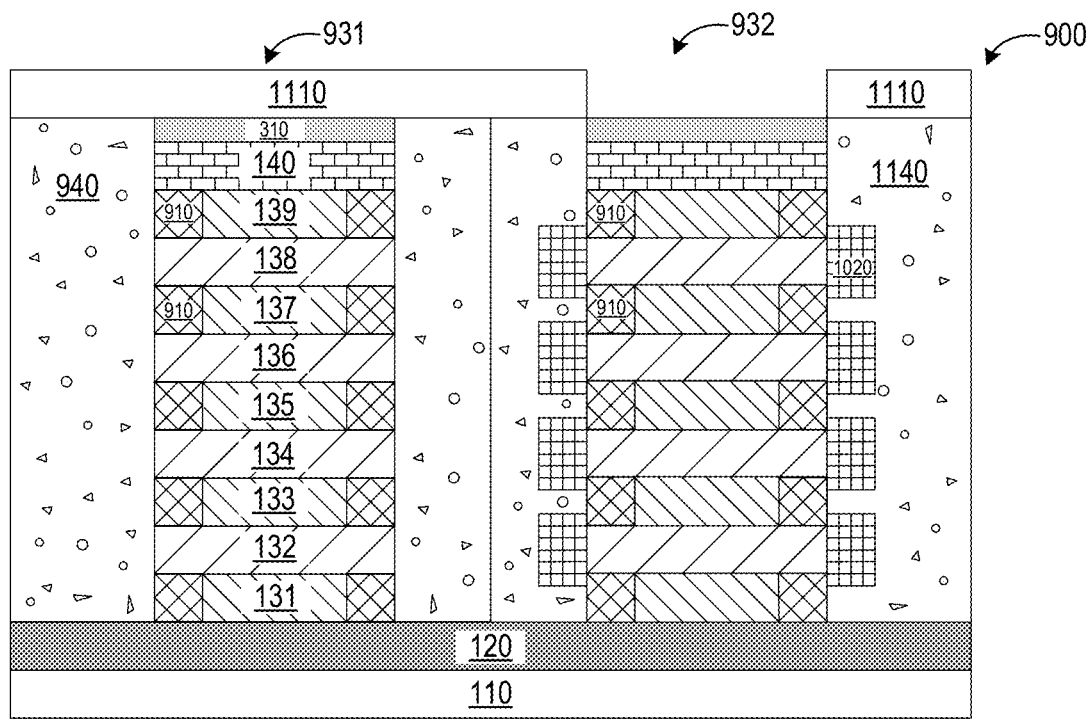

As shown in FIG. 11, the etch mask 1010 can be removed, and a dielectric material 1140 can be deposited to encapsulate the P+ S/Ds 1020 of the PMOS device 932 and be planarized by, for example, CMP. FIG. 11 further shows that an etch mask 1110 can be formed to cover the NMOS 931 and the P+ S/Ds 1020 of the PMOS device 932.

Figure 12:
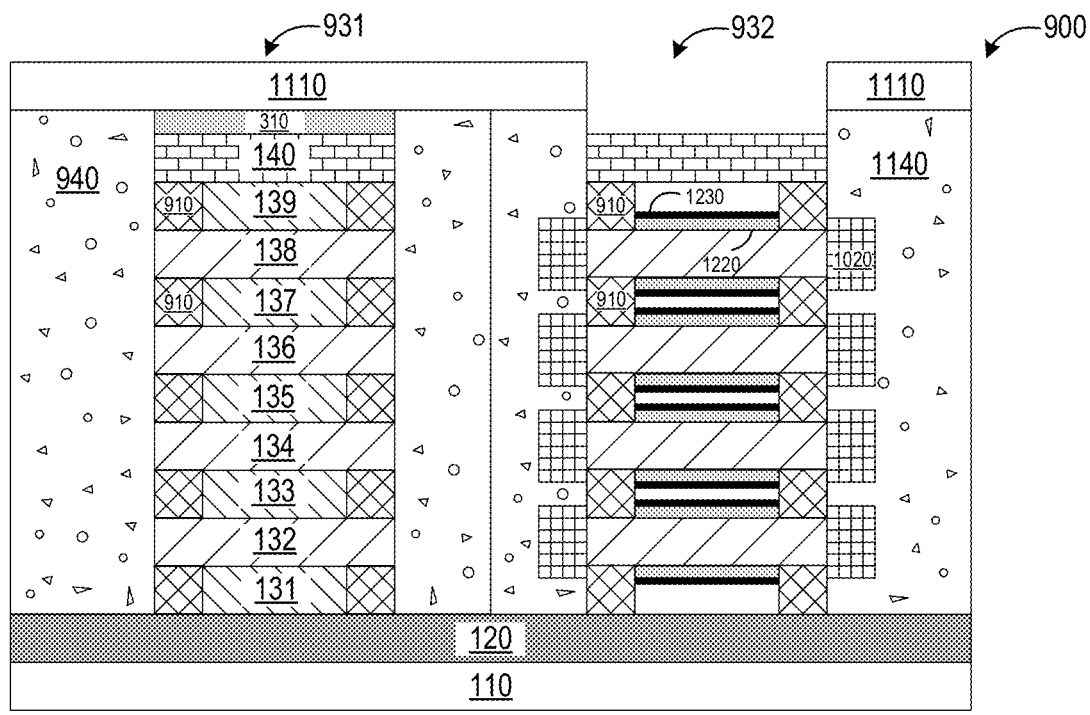

As shown in FIG. 12, a directional etch can be performed to remove the dummy gate 310 followed by the (SiGe) layers 131, 133, 135, 137 and 139 of the nanosheet stack 130 to uncover the (Si or Ge) layers 132, 134, 136 and 138 of the PMOS device 932. Optionally, the uncovered (Si or Ge) layers 132, 134, 136 and 138, which act as the channels of the PMOS device 932, can be thinned prior to (SiGe or Ge) epitaxial growth thereon depending on device design considerations. FIG. 12 further shows that a shell 1220 or covering of an epitaxy material of Si, Ge or $Si_xGe_y$, for example, can be formed (e.g., epitaxially grown) on (or around) each of the (Si or Ge) layers 132, 134, 136 and 138 to enhance the performance of the PMOS device 932. FIG. 12 further shows a high-K dielectric material deposition followed by a gate electrode metal stack 1230 on (or around) each of the shells 1220 (i.e., a channel structure) of the PMOS device 932. The PMOS device 932 can thus have lateral gate-all-around (GAA) channels, each of which includes a core semiconductor material (e.g., the layers 132, 134, 136 and 138), a shell of an epitaxy material (e.g., the shell 1220) on or around the core semiconductor material, and a gate electrode metal stack (e.g., the gate electrode metal stack 1230) around the shell.

Figure 13:
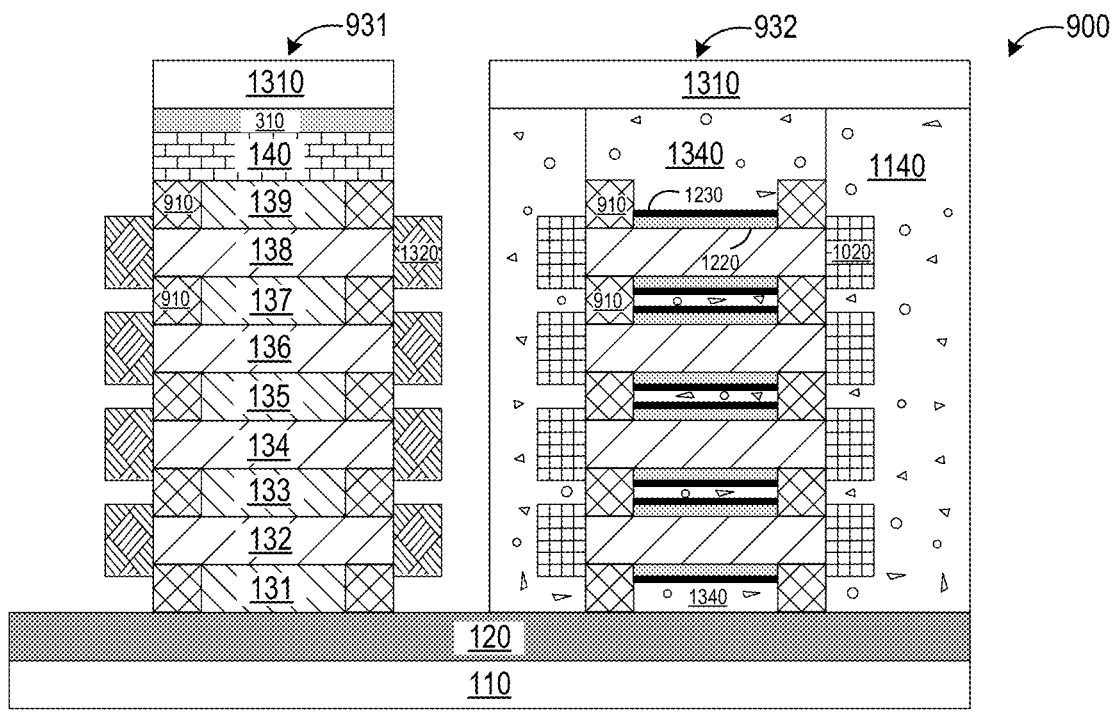

As shown in FIG. 13, the etch mask 1110 and the cap layer 140 of the PMOS device 932 can be can be removed, and a dielectric material 1340 can be deposited to fill openings to isolate the completed PMOS device 932, which has four PMOS transistors vertically stacked on each other. In an embodiment, the PMOS device 932 can have two or any number of vertically stacked PMOS transistors. FIG. 13 further shows that an etch mask 1310 can be formed to cover the PMOS device 932 and the stack 130 of the NMOS 931, and a portion of the dielectric material 940 that is not covered by the etch mask 1310 can be etched and removed to uncover S/D regions of the NMOS 931. FIG. 13 further shows that an N– material can be formed (e.g., epitaxially grown) from an end portion of the (Si or Ge) layers 132, 134, 136 and 136 of the NMOS device 931 in the channel direction to form N– S/Ds 1320 of the NMOS device 931.

Figure 14:
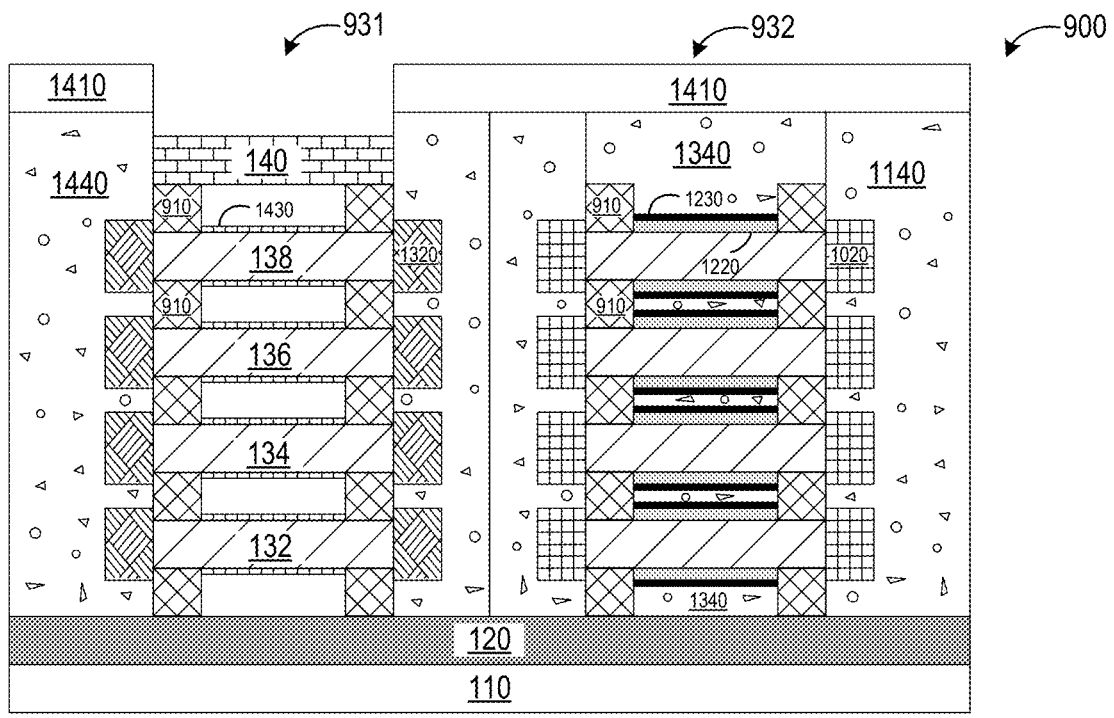

As shown in FIG. 14, the etch mask 1310 can be removed, and a dielectric material 1440 can be deposited to encapsulate the N– S/Ds 1320 of the NMOS device 931, and be planarized via, for example, CMP. FIG. 14 further shows that an etch mask 1410 can be formed to cover the PMOS device 932 and the N– S/Ds 1320 of the NMOS device 931, and a directional etch can be performed to remove the dummy gate 310 followed by the (SiGe) layers 131, 133, 135, 137 and 139 of the nanosheet stack 130. FIG. 14 further shows a high-K dielectric material deposition followed by a gate electrode metal stack 1430 on (or around) each of the (Si or Ge) layers 132, 134, 136 and 138.

Figure 15:
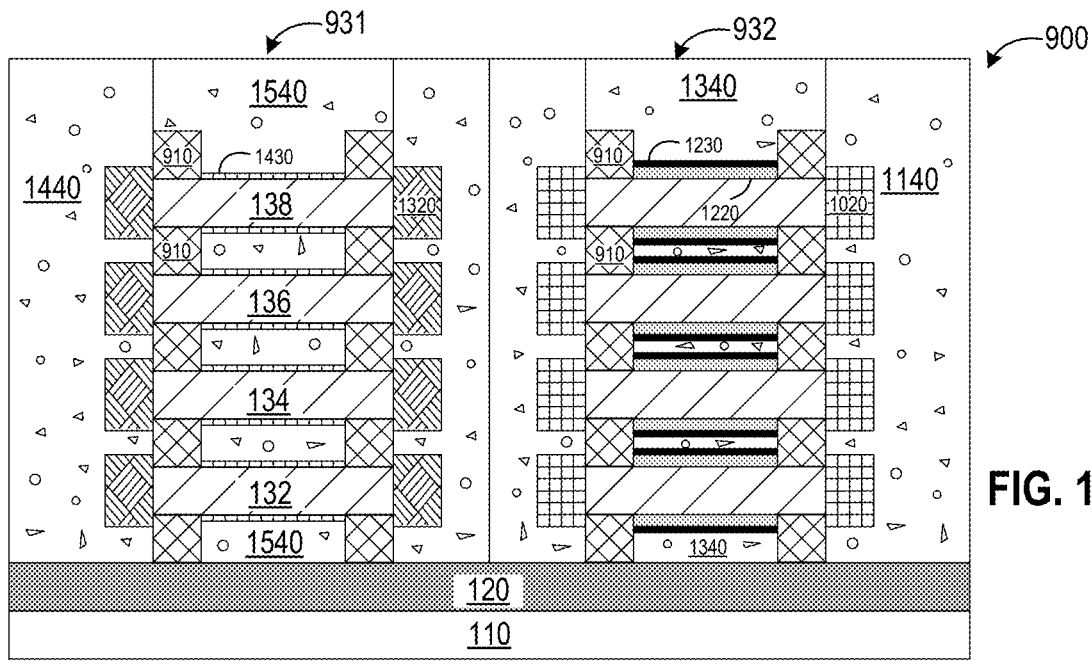
Figure 15A:
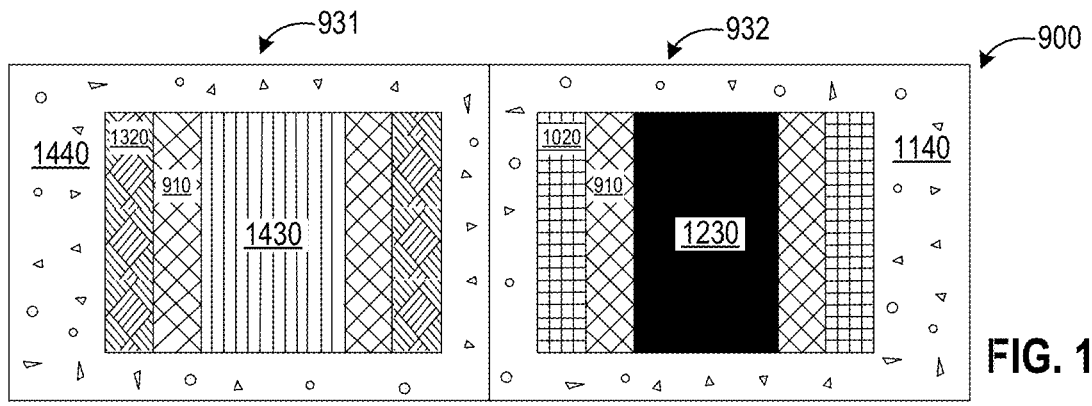
FIG. 15A is a top view of the second semiconductor device shown in FIG. 15.
Figure 15B:
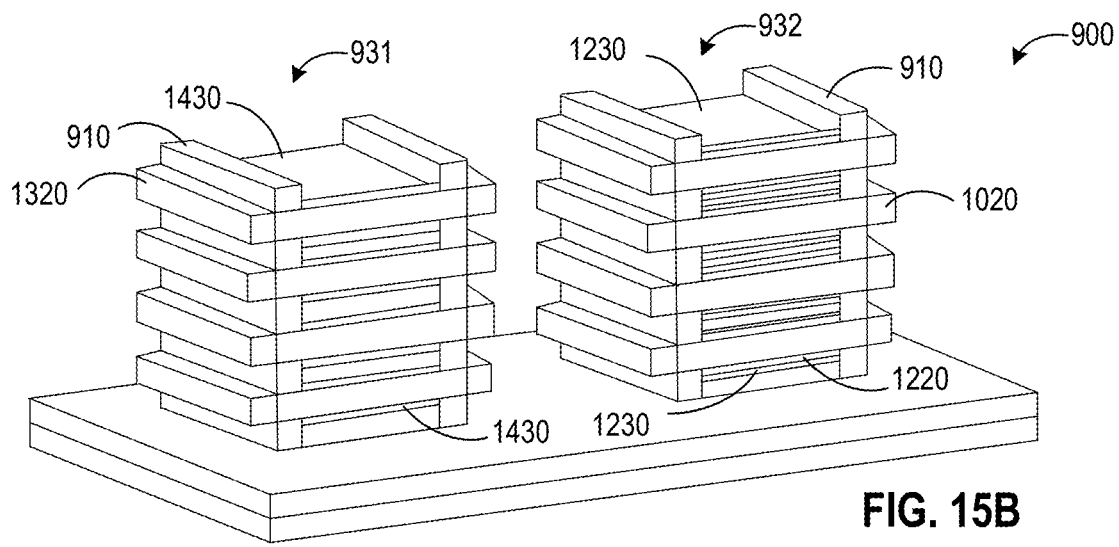
FIG. 15B is a schematic diagram of the second semiconductor device shown in FIG. 15.

As shown in FIG. 15, the etch mask 1410 and the cap layer 140 can be etched and removed via, for example, CMP, and a dielectric material 1540 can be deposited to fill openings to isolate the completed NMOS device 931, which has four NMOS transistors vertically stacked on each other. In an embodiment, the NMOS device 931 can have two or any number of vertically stacked NMOS transistors. The NMOS device 931 can thus have lateral GAA channels, each of which includes a core semiconductor material (e.g., the layers 132, 134, 136 and 138) and a gate electrode metal stack (e.g., the gate electrode metal stack 1430) around the core semiconductor material. FIG. 15A is a top view of the second semiconductor device 900 shown in FIG. 15. FIG. 15B is a schematic diagram of the second semiconductor device 900 shown in FIG. 15.

Figure 16:
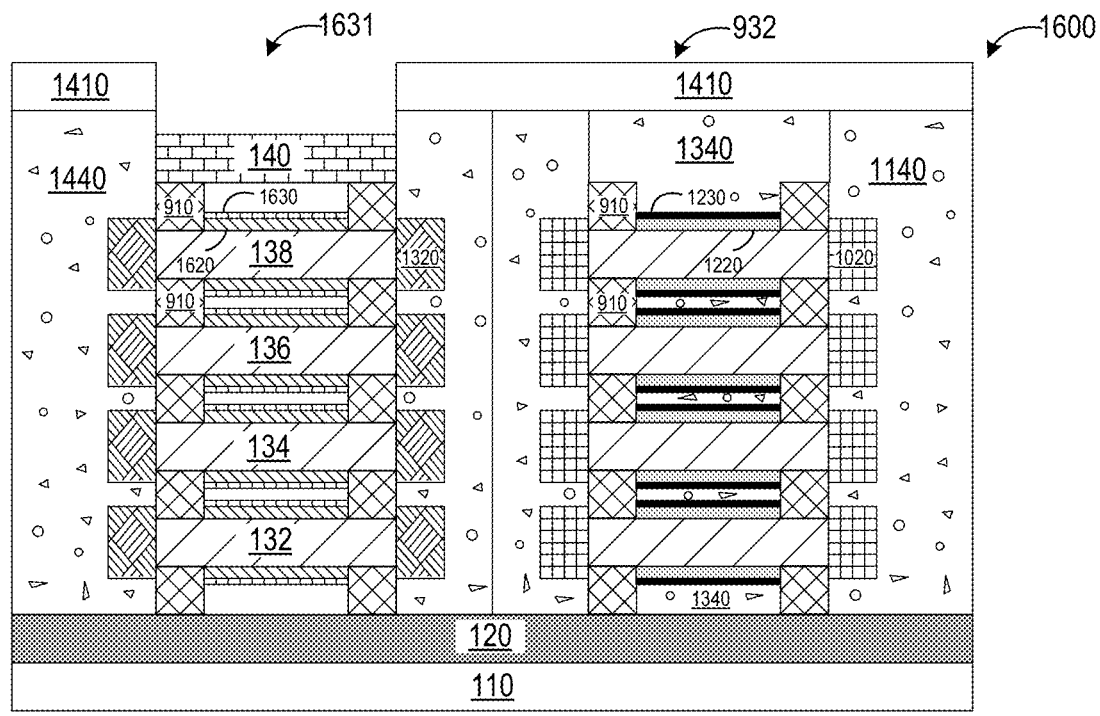
FIGS. 16 and 17 illustrate a third exemplary method for fabricating a third semiconductor device according to some embodiments of the present disclosure.
Figure 17:
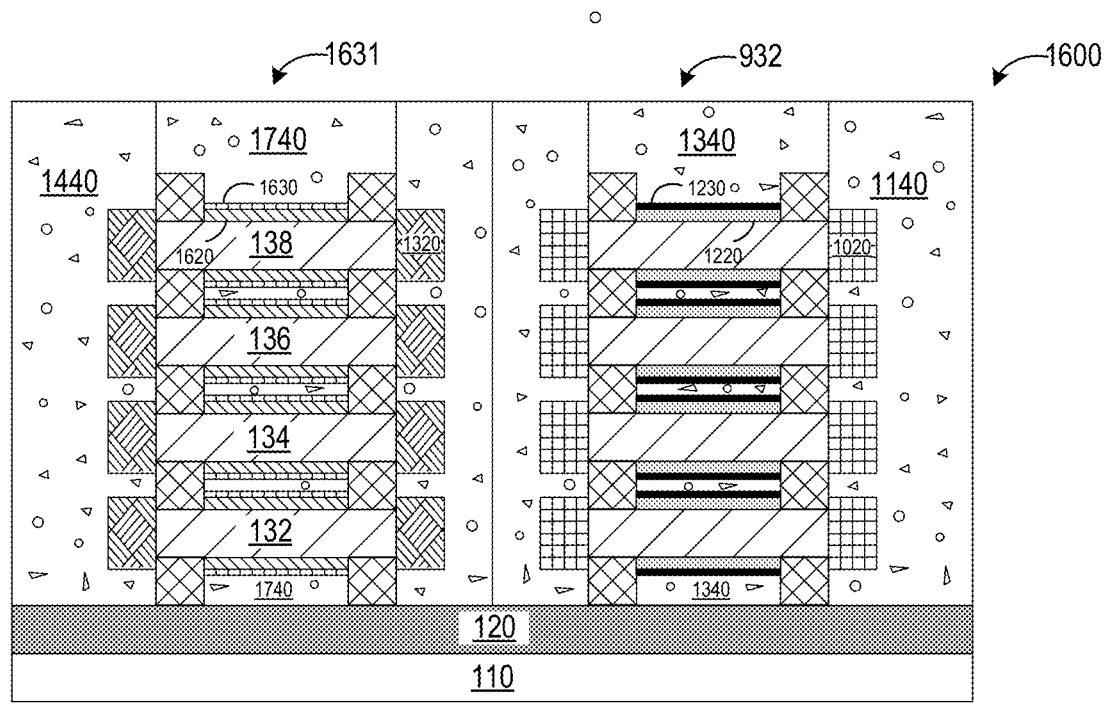

FIGS. 16 and 17 illustrate a third exemplary method for fabricating a third semiconductor device 1600 according to some embodiments of the present disclosure. The second semiconductor device 1600 differs from the second semiconductor device 900 at least in that the third semiconductor device 1600 can replace the NMOS device 931 with an NMOS device 1631 that has a shell 1620 or covering of an epitaxy material of Si, Ge or $Si_xGe_y$, for example, that can be formed (e.g., epitaxially grown) on (or around) each of the (Si or Ge) layers 132, 134, 136 and 138 to enhance the performance of the NMOS device 1631. As shown in FIG. 16, which follows FIG. 13, the etch mask 1310 can be removed, and the dielectric material 1440 can be deposited to encapsulate the N– S/Ds 1320 of the NMOS device 1631, and be planarized via, for example, CMP. FIG. 16 further shows that the etch mask 1410 can be formed to cover the PMOS device 932 and the N– S/Ds 1320 of the NMOS device 1631, and a directional etch can be performed to remove the dummy gate 310 followed by the (SiGe) layers 131, 133, 135, 137 and 139 of the nanosheet stack 130 to uncover the (Si or Ge) layers 132, 134, 136 and 138. Optionally, the uncovered (Si or Ge) layers 132, 134, 136 and 138, which act as the channels of the NMOS device 1631, can be thinned prior to (SiGe or Ge) epitaxial growth thereon depending on device design considerations. FIG. 16 further shows that a shell 1620 or covering of an epitaxy material of Si, Ge or $Si_xGe_y$, for example, can be formed (e.g., epitaxially grown) on (or around) each of the (Si or Ge) layers 132, 134, 136 and 138 to enhance the performance of the NMOS device 1631. FIG. 16 further shows a high-K dielectric material deposition followed by a gate electrode metal stack 1630 on (or around) each of the shells 1620 (i.e., a channel structure) of the NMOS device 1631.

As shown in FIG. 17, the etch mask 1410 and the cap layer 140 of the NMOS device 1631 can be etched and removed via, for example, CMP, and a dielectric material 1740 can be deposited to fill openings to isolate the completed NMOS device 1631.

Figure 18:
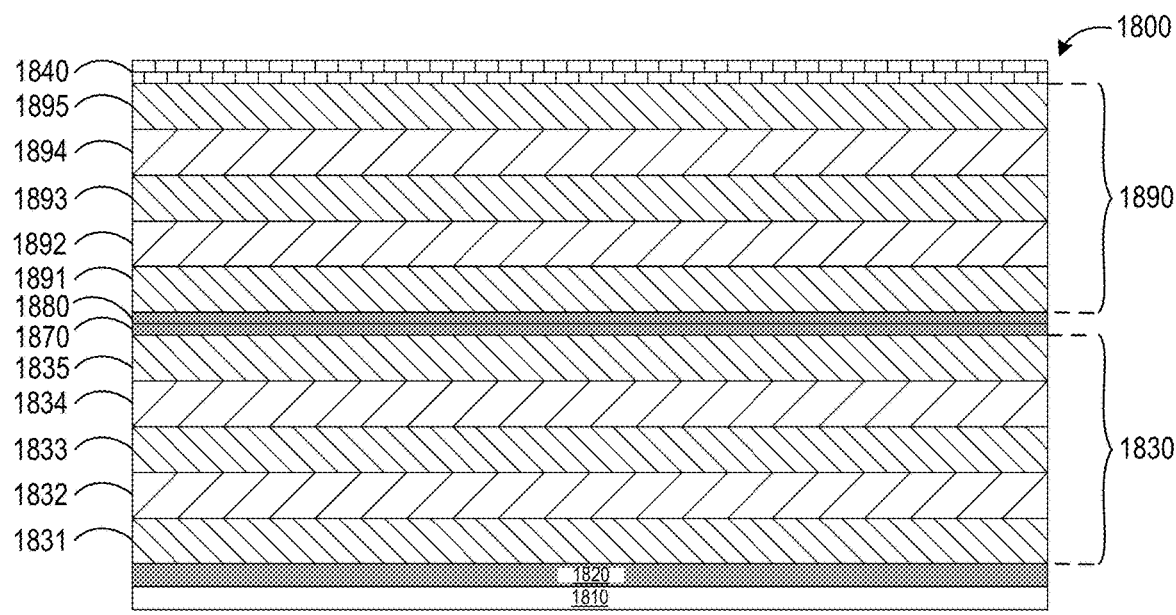
FIGS. 18-27 illustrate a fourth exemplary method for fabricating a fourth semiconductor device according to some embodiments of the present disclosure.

FIGS. 18-27 illustrate a fourth exemplary method for fabricating a fourth semiconductor device 1800 according to some embodiments of the present disclosure. As shown in FIG. 18, the fourth semiconductor device 1800 can include a substrate 1810, a dielectric layer 1820 formed on the substrate 1810, a first stack 1830 of alternating layers 1831-1835 stacked on the dielectric layer 1820, a first dielectric layer 1870 formed on the first stack 1830 of alternating layers 1831-1835, a second dielectric layer 1880 formed on the first dielectric layer 1870, a second stack 1890 of alternating layers 1891-1895 stacked on the second dielectric layer 1880, and a cap layer 1840 formed on the second stack 1890 of alternating layers 1891-1895. In an embodiment, the first dielectric layer 1870 and the second dielectric layer 1880 can be a single dielectric layer acting as an interface of the first stack 1830 and the second stack 1890. For example, a first wafer that has the substrate 1810, the dielectric layer 1820 and the first stack 1830 (and the first dielectric layer 1870) can be provided, a second wafer that has a similar substrate/stack to the substrate 1810/the first stack 1830 of the first wafer can also be provided, e.g., including a substrate, a dielectric layer formed on the substrate, and the second stack 1890 formed on the dielectric layer (and the second dielectric layer 1880), the second wafer can be bonded to the first wafer in a flip-chip manner using a dielectric layer (e.g., the first dielectric layer 1870 and the second dielectric layer 1880) as the interface of the first stack 1830 and the second stack 1890, and the substrate and the dielectric layer of the second wafer can be removed. For example, the substrate 1810 can be a silicon substrate or an SOI substrate (or a silicon/dielectric/silicon substrate). As another example, the cap layer 1840 can include a hardmask material. In an embodiment, the first stack 1830 of alternating layers 1831-1835 can be a first nanosheet stack 1830 of alternating layers 1831-1835, the layers 1831, 1833 and 1835 can include the same material as the layers 131, 133, 135, 137 and 139 of the stack 130 of the first semiconductor device 100, e.g., SiGe, and the layers 1832 and 1834 can include the same material as the layers 132, 134, 136 and 138 of the stack 130 of the first semiconductor device 100, e.g., Si or Ge. In another embodiment, the second stack 1890 of alternating layers 1891-1895 can be a second nanosheet stack 1890 of alternating layers 1891-1895, the layers 1891, 1893 and 1895 can include the same material as the layers 131, 133, 135, 137 and 139 of the stack 130 of the first semiconductor device 100, e.g., SiGe, and the layers 1892 and 1894 can include the same material as the layers 132, 134, 136 and 138 of the stack 130 of the first semiconductor device 100, e.g., Si or Ge.

Figure 19:
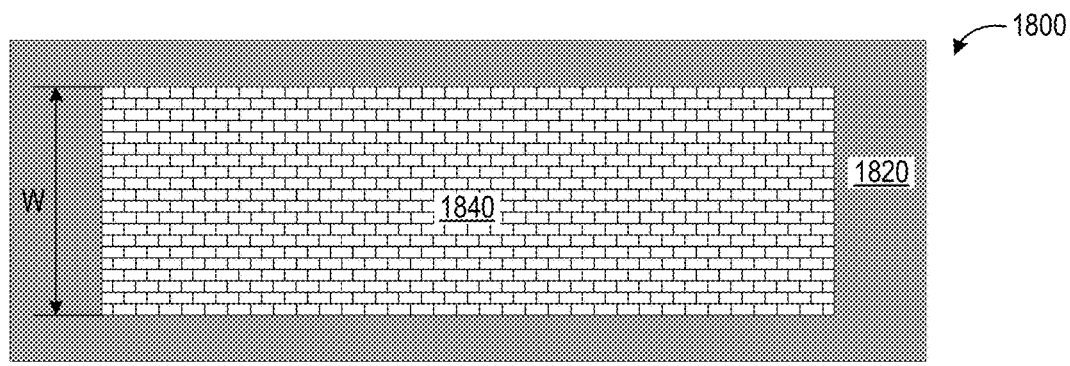

As shown in FIG. 19, which is a top view of the fourth semiconductor device 1800, the fourth semiconductor device 1800 can be etched to define a width W of the fourth semiconductor device 1800.

Figure 20:
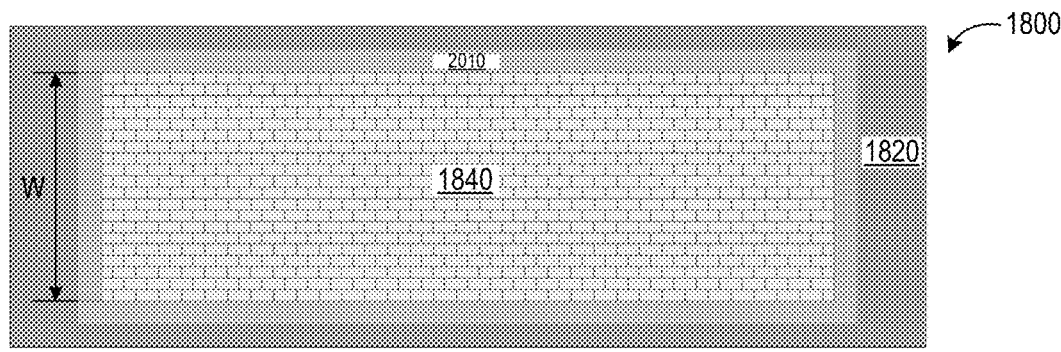

As shown in FIG. 20, which is a top view of the fourth semiconductor device 1800, a dielectric deposition can be followed by a dummy gate 2010 deposition. In an embodiment, the entire width W of the first nanosheet stack 1830 and the second nanosheet stack 1890 can be encapsulated with the dummy gate 2010. For example, the dummy gate 2010 can be a dummy stack of oxide/poly/nitride.

Figure 21:
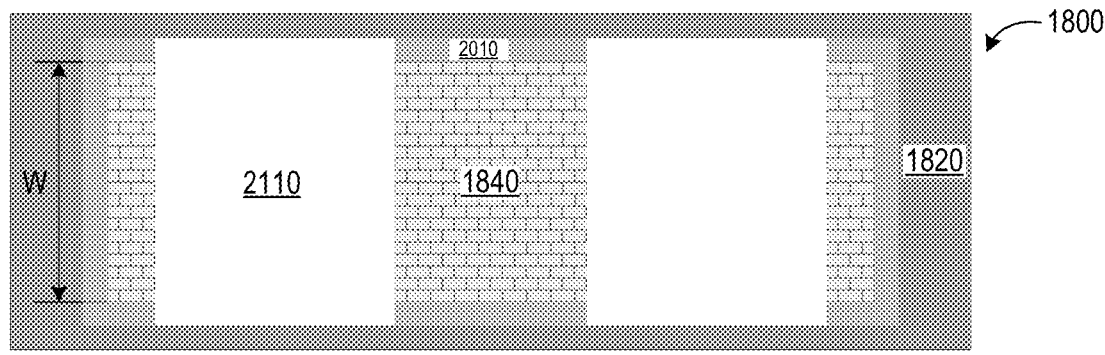

As shown in FIG. 21, which is a top view of the fourth semiconductor device 1800, an etch mask 2110 can be formed on the fourth semiconductor device 1800, and the fourth semiconductor device 1800 can be further etched to define a length L of the fourth semiconductor device 1800.

Figure 22:
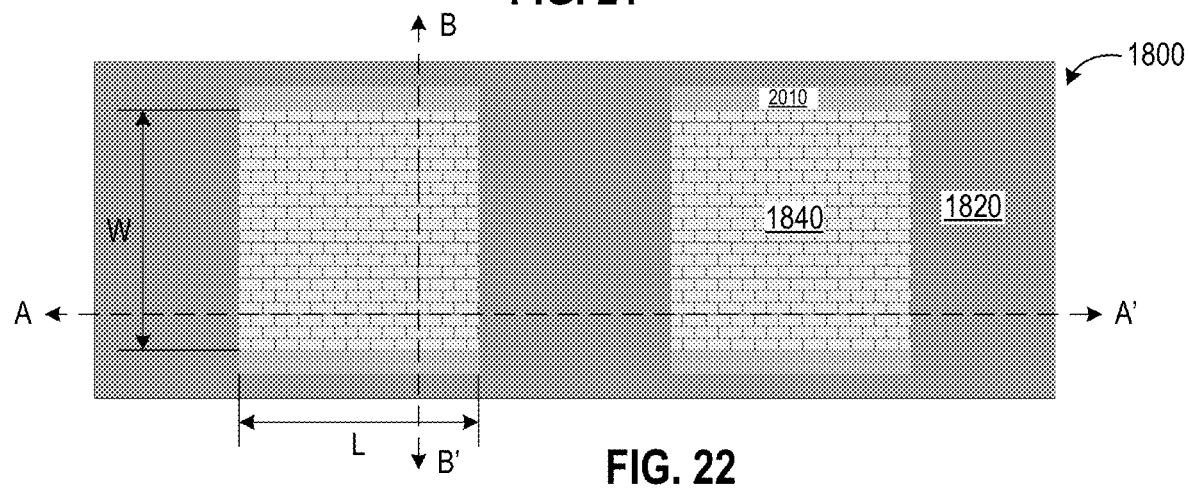
Figure 22A:
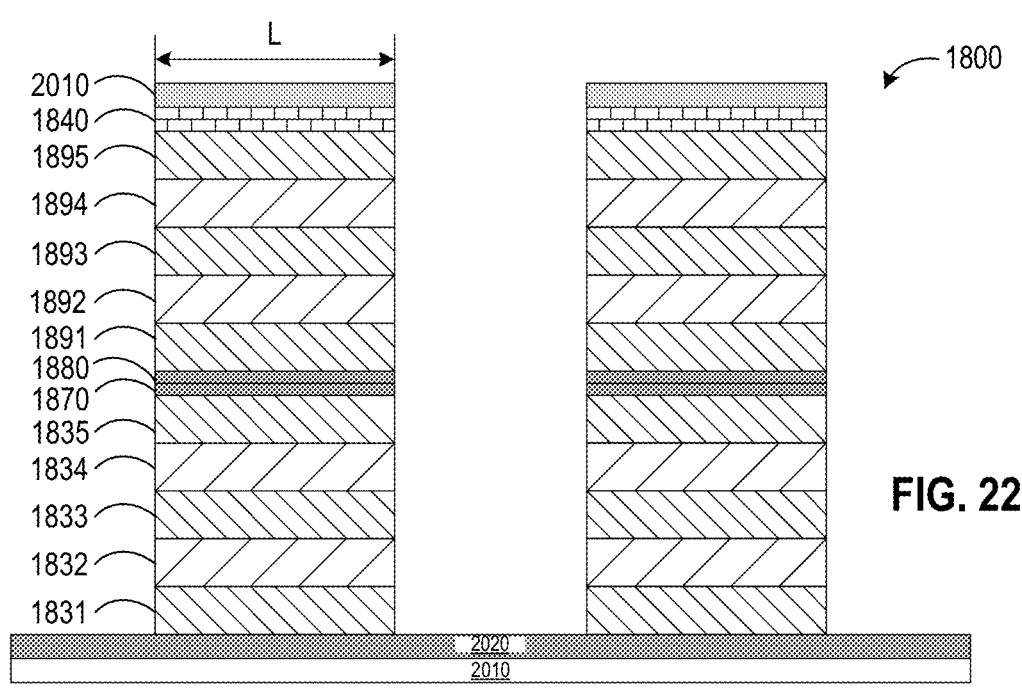
Figure 22B:
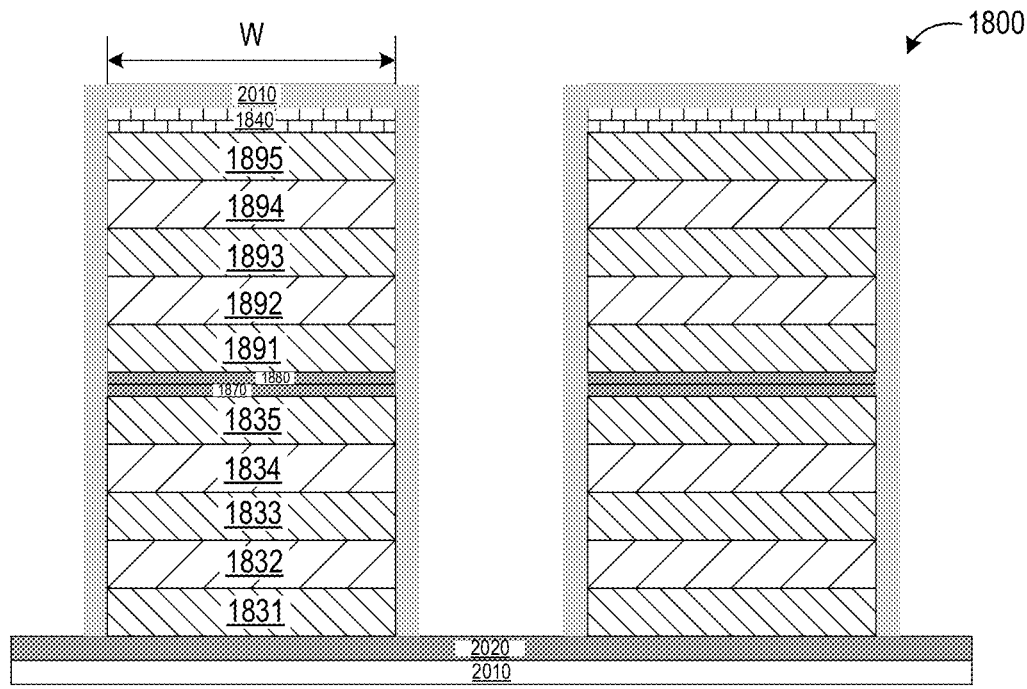

As shown in FIG. 22, which is a top view of the fourth semiconductor device 1800, the etch mask 2110 can be removed, and beneath the cap layer 1840 are the first nanosheet stack 1830 and the second nanosheet stack 1890 with the dummy gate 2010 covering the top and widthwise surfaces thereof. FIG. 22A is a cross-sectional view of the fourth semiconductor device 1800 through a line AA' of FIG. 22. FIG. 22B is a cross-sectional view of the semiconductor device 180 through a line BB' of FIG. 22.

Figure 23:
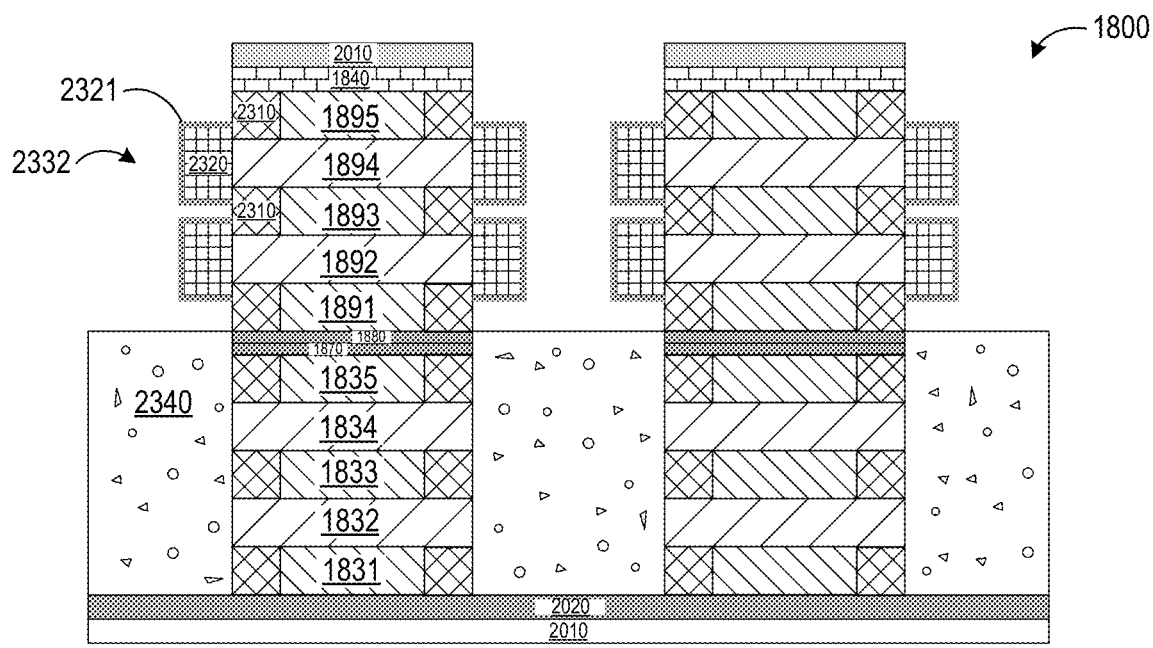

As shown in FIG. 23, which follows FIG. 22A, indent etch (e.g., SiGe indent etch) can be followed by dielectric deposition and etch forming dielectric spacers. For example, an end portion of the (e.g., SiGe) layers 1831, 1833 and 1835 of the first stack 1830 and the (e.g., SiGe) layers 1891, 1893 and 1895 of the second stack 1890, which can be etched selectively with respect to the layers 1892 and 1894 of the second stack 1890 and the layers 1832 and 1834 of the first stack 1830, can be etched in the channel direction to define indents, and a dielectric material can fill the indents and be planarized via, for example, etching to form dielectric spacers 2310. In an embodiment, the dielectric spacers 2310 can provide support once the (SiGe) layers 1831, 1833, 1835, 1891, 1893 and 1895 are removed. FIG. 23 further shows that a dielectric material 2340 can be deposited to encapsulate the first stack 1830. FIG. 23 further shows that a P+ material can be formed (e.g., epitaxially grown) from an end portion of the (e.g., Si or Ge) layers 1892 and 1894 of the second stack 1890 to form P+ S/Ds 2320 of a PMOS device 2332. FIG. 23 further shows that a second selective dielectric material 2321 can be deposited to protect the P+ S/Ds 2320 of the PMOS device 2332 while the first stack 1830 and the second stack 1890 are processed. In an embodiment, the second selective dielectric material 2321 can be etched selectively with respect to the first stack 1830 and the second stack 1890.

Figure 24:
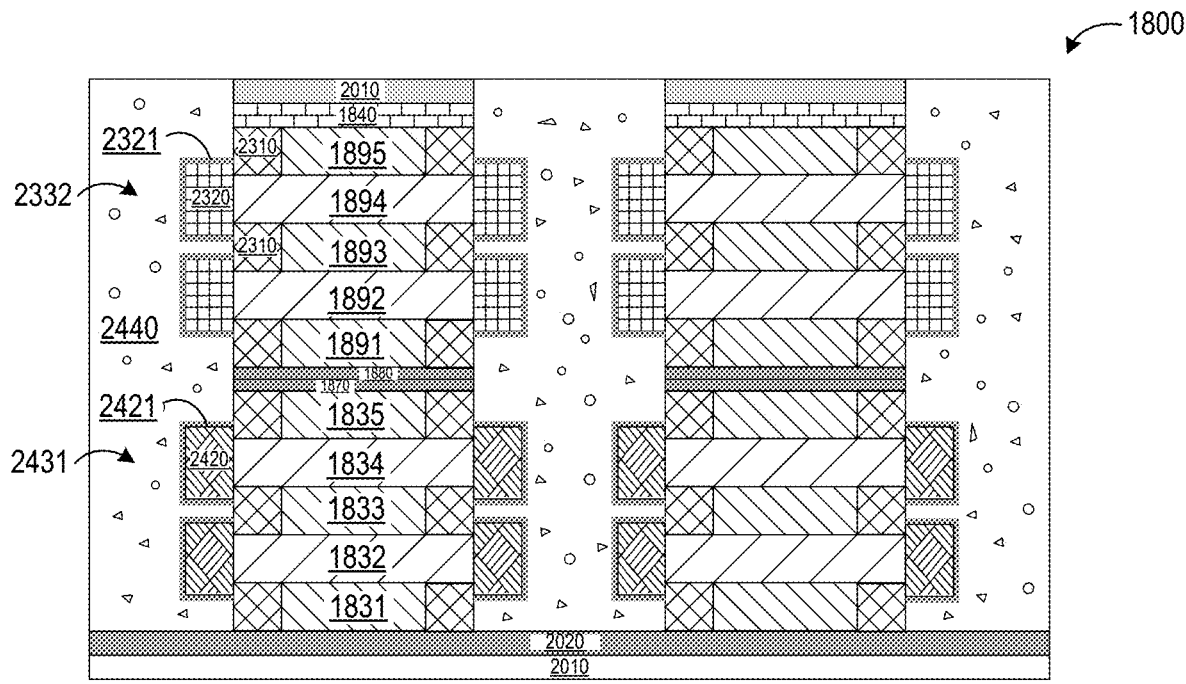

As shown in FIG. 24, the dielectric material 2340 can be etched and removed via, for example, CMP, to uncover the first stack 1830. FIG. 24 further shows that an N− material can be formed (e.g., epitaxially grown) from an end portion of the (Si or Ge) layers 1832 and 1834 of the first stack 1830 to form N− S/Ds 2420 of an NMOS device 2431. FIG. 24 further shows that a first selective dielectric material 2421 can be deposited to protect the N− S/Ds 2420 of the NMOS device 2431 while the first stack 1830 and the second stack 1890 are processed. In an embodiment, the first selective dielectric material 2421 can be etched selectively with respect to the first stack 1830 and the second stack 1890. FIG. 24 further shows that a dielectric material 2440 can be deposited to encapsulate the PMOS device 2332 and the NMOS device 2431 and be planarized via CMP.

Figure 25:
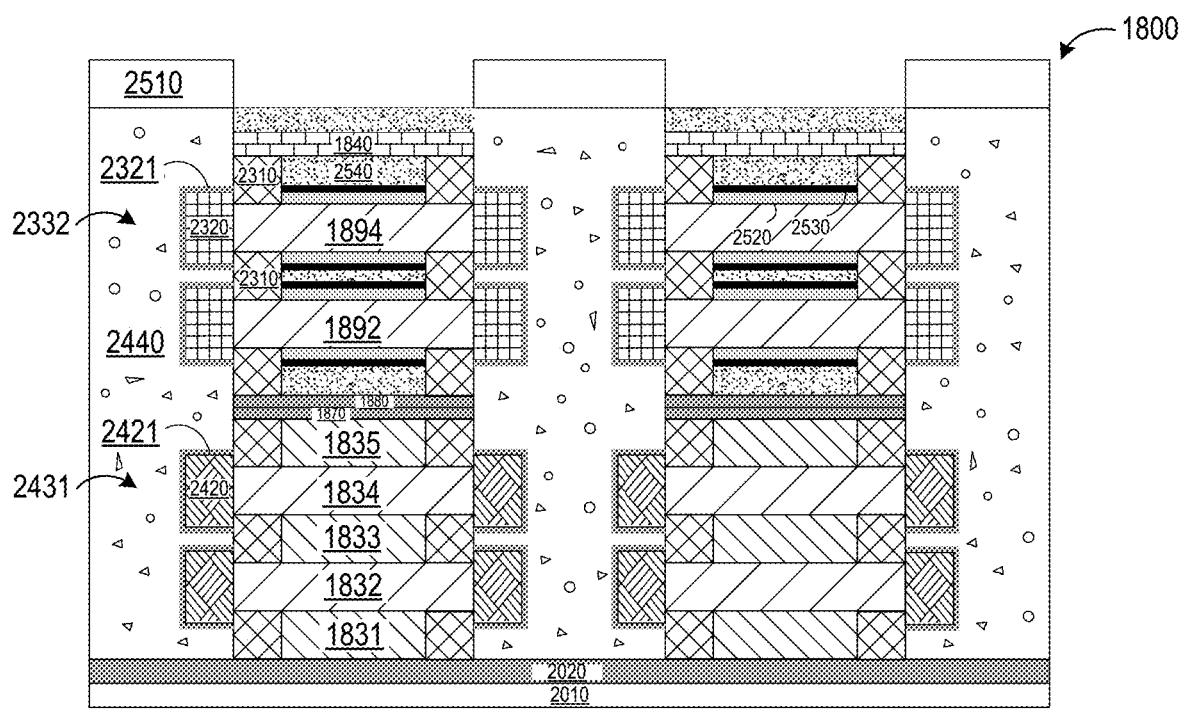

As shown in FIG. 25, an etch mask 2510 can be deposited to cover the P+ S/Ds 2320 of the PMOS device 2332 and the N− S/Ds 2420 of the NMOS 2431, and a directional etch can be performed to remove the dummy gate 2010 for the second stack 1890 followed by the (SiGe) layers 1891, 1893 and 1895 of the second stack 1890 to uncover the (Si or Ge) layers 1892 and 1894. Optionally, the uncovered (Si or Ge) layers 1892 and 1894, which act as the channels of the PMOS deice 2332, can be thinned prior to (SiGe or Ge) epitaxial growth thereon depending on device design considerations. FIG. 25 further shows that a shell 2520 or covering of an epitaxy material of SiC, for example, can be form (e.g., epitaxially grown) on (or around) each of the (Si or Ge) layers 1892 and 1894 to enhance the performance of the PMOS device 2332. FIG. 25 further shows a high-K dielectric material deposition followed by a gate electrode metal stack 2530 on (or around) each of the shells 2520 (i.e., a channel structure) of the PMOS device 2332. FIG. 25 further shows that a dummy insulator gate (or a dielectric layer) 2540 can be formed to fill openings to protect the completed PMOS device 2332, which have two PMOS transistors vertically stacked on each other. In an embodiment, the PMOS device 2332 can have more than two vertically stacked PMOS transistors. In an embodiment, the dummy insulator gate 2540 can be etched selectively with respect to the dummy gate 2010 and the first stack 1830.

Figure 26:
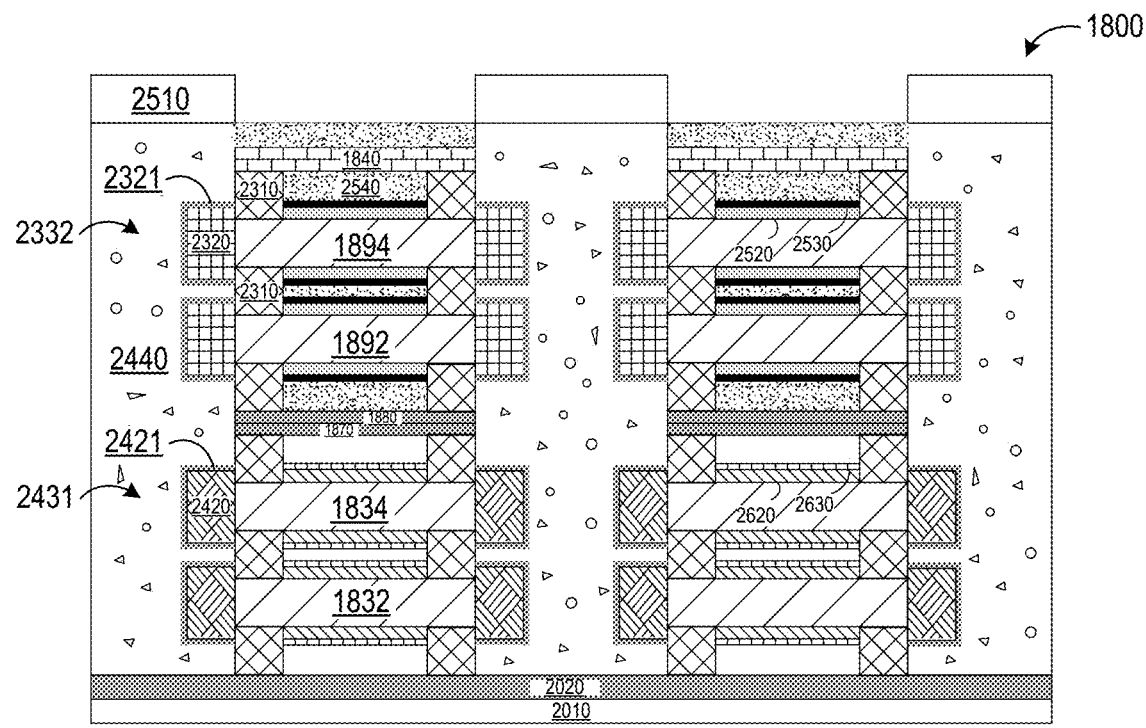

As shown in FIG. 26, a directional etch can be performed to remove the dummy gate 2010 for the first stack 1830 followed by the (SiGe) layers 1831, 1833 and 1835 of the first stack 1830 to uncover the (Si or Ge) layers 1832 and 1834. Optionally, the uncovered (Si or Ge) layers 1832 and 1834, which act as the channels of the NMOS deice 2431, can be thinned prior to (SiGe or Ge) epitaxial growth thereon depending on device design considerations. FIG. 26 further shows that a shell or graded epitaxial shells 2620 or coverings of an epitaxy materials of SiGe and Ge, for example, can be sequentially formed (e.g., epitaxially grown) on (or around) each of the (Si or Ge) layers 1832 and 1834 to enhance the performance of the NMOS device 2431. FIG. 26 further shows a high-K dielectric material deposition followed by a gate electrode metal stack 2630 on (or around) each of the shells 2620 (i.e., a channel structure) of the NMOS device 2431. In an embodiment, the gate electrode metal stack 2630 can be deposited directly on (or around) each of the (Si or Ge) layers 1832 and 1834, as the NMOS device 931 of the second semiconductor device 900 shown in FIGS. 14 and 15, thereby omitting the formation of the shells 2620.

Figure 27:
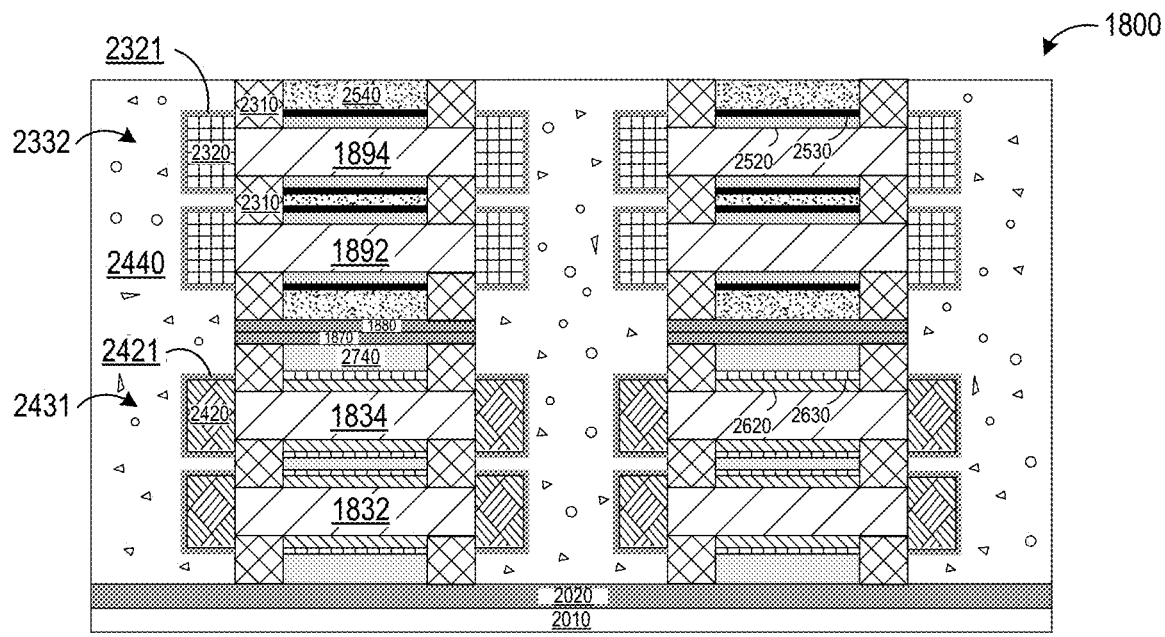

As shown in FIG. 27, a dielectric material 2740 can be formed to fill openings to protect the completed (lateral gate-all-around (GAA) channels having epitaxial shells) NMOS device 2431, which have two NMOS transistors vertically stacked on each other. In an embodiment, the NMOS device 2431 can have more than two vertically stacked NMOS transistors. The PMOS device 2332 and the NMOS device 2431 can form a CFET CMOS device.

FIG. 18-27 shows that the fourth semiconductor device 1800 includes a P-P-N-N MOS transistors stack. In an embodiment, the stack can include N-N-N-N, P-P-P-P or N-N-P-P MOS transistors, which can be divided into two sub-stacks. For example, the sub-stacks or the transistors can be shorted together or isolated. As another example, the sub-stacks can have different heights and widths.

Figure 28:
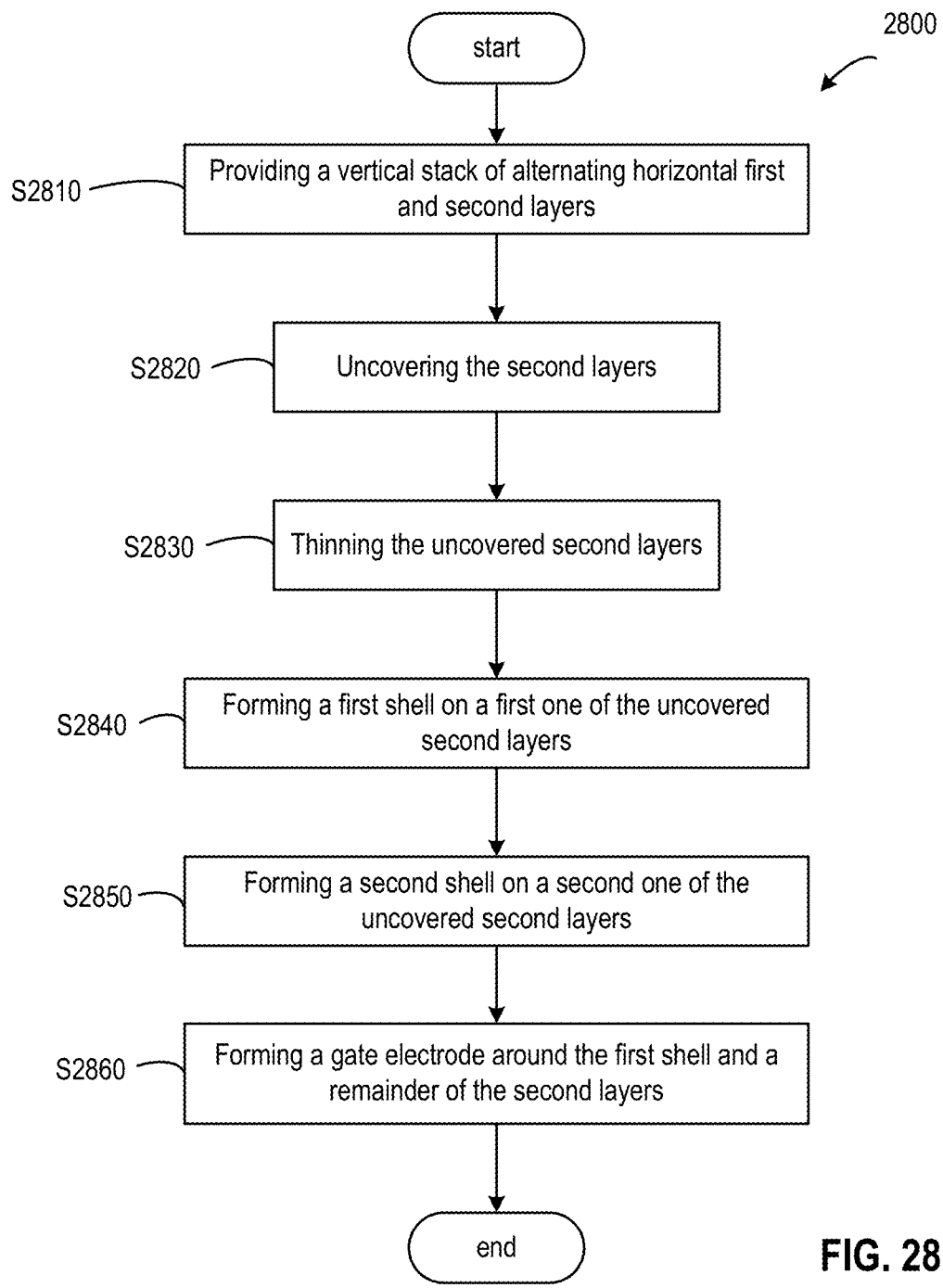
FIG. 28 is a flow chart illustrating a fifth exemplary method for fabricating a semiconductor device according to some embodiments of the present disclosure.

FIG. 28 is a flow chart illustrating a fifth exemplary method 2800 for fabricating a semiconductor device including a plurality of vertically stacked transistors according to some embodiments of the present disclosure. In an embodiment, some of the steps of the fifth exemplary method 2800 shown can be performed concurrently or in a different order than shown, can be substituted by other method steps, or can be omitted. Additional method steps can also be performed as desired. In some embodiments, the fifth exemplary method 2800 can correspond to the first to fourth semiconductor devices 100, 900, 1600 and 1800 shown in FIGS. 1-27.

At step S2810, a vertical stack of alternating horizontal first and second layers can be provided. For example, the stack 130 of alternating layers 131, 133, 135, 137 and 139 and layers 132, 134, 136 and 138 can be provided, as shown in FIG. 1. As another example, a vertical stack can be provided that includes the first stack 1830, which has alternating layers 1831, 1833 and 1835 and layers 1832 and 1834, and the second stack 1890, which has alternating layers 1891, 1893 and 1895 and layers 1892 and 1894, as shown in FIG. 18. In an embodiment, the second layers can form channels of the transistors. For example, the layers 132, 134, 136 and 138 can form the channels of the PMOS (or NMOS) devices 631 and 632, as shown in FIG. 8. As another example, the layers 1832 and 1834 can form the channels of the NMOS device 2431, and the layers 1892 and 1894 can form the channels of the PMOS device 2332, as shown in FIG. 27.

At step S2820, the second layers can be uncovered. For example, an end portion of the layers 131, 133, 135, 137 and 139 in the channel direction can be removed to form indents, the dielectric spacers (or spacers) 610 can be formed to fill the indents, and the remainder of the first layers 131, 133, 135, 137 and 139 can be removed to uncover the layers 132, 134, 136 and 138, as shown in FIGS. 7 and 12. As another example, an end portion of the layers 1831, 1833, 1835, 1891, 1893 and 1895 in the channel direction can be removed to form indents, the dielectric spacers (or spacers) 2310 can be formed to fill the indents, and the remainder of the first layers 1831, 1833, 1835, 1891, 1893 and 1895 can be removed to uncover the layers 1832, 1834, 1892 and 1894, as shown in FIG. 25.

At step S2830, optionally, the uncovered second layers can be thinned. For example, the uncovered layers 132, 134, 136 and 138 can be thinned, as shown in FIGS. 7 and 12. As another example, the uncovered layers 1832, 1834, 1892 and 1894 can be thinned, as shown in FIG. 25.

At step S2840, a first shell can be formed on a first one of the uncovered second layers. For example, the shell 720 can be formed (e.g., epitaxially grown) on (or around) each of the uncovered layers 132, 134, 136 and 138, as shown in FIG. 7, and the shell 1220 can be formed (e.g., epitaxially grown) on (or around) each of the uncovered layers 132, 134, 136 and 138, as shown in FIG. 12. As another example, the shell 2520 can be formed (e.g., epitaxially grown) on (or around) each of the uncovered layers 1892 and 1894, as shown in FIG. 25.

At step S2850, a second shell can be formed on a second one of the uncovered second layers. For example, the shell 1620 can be formed (e.g., epitaxially grown) on (or around) each of the uncovered layers 132, 134, 136 and 138, as shown in FIG. 16. As another example, the shell 2620 can be formed (e.g., epitaxially grown) on (or around) each of the uncovered layers 1832 and 1834, as shown in FIG. 26.

At step S2860, a gate electrode can be formed around the first shell and a remainder of the second layers. For example, the gate electrode metal stack 730 can be formed around the shell 720, as shown in FIG. 7, and the gate electrode metal stack 1230 can be formed around the shell 1220, as shown in FIG. 12. As another example, the gate electrode metal stack 1430 can be formed around the layers 132, 134, 136 and 138 of the NMOS device 931, as shown in FIG. 14.

In the preceding description, specific details have been set forth, such as a particular geometry of a processing system and descriptions of various components and processes used therein. It should be understood, however, that techniques herein may be practiced in other embodiments that depart from these specific details, and that such details are for purposes of explanation and not limitation. Embodiments disclosed herein have been described with reference to the accompanying drawings. Similarly, for purposes of explanation, specific numbers, materials, and configurations have been set forth in order to provide a thorough understanding. Nevertheless, embodiments may be practiced without such specific details. Components having substantially the same functional constructions are denoted by like reference characters, and thus any redundant descriptions may be omitted.

Various techniques have been described as multiple discrete operations to assist in understanding the various embodiments. The order of description should not be construed as to imply that these operations are necessarily order dependent. Indeed, these operations need not be performed in the order of presentation. Operations described may be performed in a different order than the described embodiment. Various additional operations may be performed and/or described operations may be omitted in additional embodiments.

"Substrate" or "target substrate" as used herein generically refers to an object being processed in accordance with the present disclosure. The substrate may include any material portion or structure of a device, particularly a semiconductor or other electronics device, and may, for example, be a base substrate structure, such as a semiconductor wafer, reticle, or a layer on or overlying a base substrate structure such as a thin film. Thus, substrate is not limited to any particular base structure, underlying layer or overlying layer, patterned or un-patterned, but rather, is contemplated to include any such layer or base structure, and any combination of layers and/or base structures. The description may reference particular types of substrates, but this is for illustrative purposes only.

Those skilled in the art will also understand that there can be many variations made to the operations of the techniques explained above while still achieving the same objectives of the present disclosure. Such variations are intended to be covered by the scope of this disclosure. As such, the foregoing descriptions of embodiments of the present disclosure are not intended to be limiting. Rather, any limitations to embodiments of the present disclosure are presented in the following claims.

What is claimed is:

1. A method of fabricating a semiconductor device including a plurality of vertically stacked transistors, comprising:
    providing a vertical stack of alternating horizontal first and second layers, the second layers forming channels of the transistors;
    uncovering the second layers;
    forming a first shell on a first one of the uncovered second layers, the first shell and the first one of the uncovered second layers forming a first channel structure of a first one of the transistors; and
    forming a second shell on a second one of the uncovered second layers, the second shell and the second one of the uncovered second layers forming a second channel structure of a second one of the transistors, wherein the first channel structure is a P-type channel structure, and the second channel structure is an N-type channel structure, or
    forming a second shell on a second one of the uncovered second layers, the second shell and the second one of the uncovered second layers forming a portion of a second channel structure of a second one of the transistors, wherein the first and second shells include different materials.

2. The method of claim 1, wherein forming a first shell on a first one of the uncovered second layers includes epitaxially growing a first shell on a first one of the uncovered second layers.

3. The method of claim 2, wherein at least one of the first shell and the second layers includes an element selected from groups III, IV and V of the periodic table.

4. The method of claim 3, wherein at least one of the first shell and the second layers includes boron (B), carbon (C), nitrogen (N), aluminum (Al), silicon (Si), phosphorus (P), gallium (Ga), germanium (Ge), arsenic (As), indium (In), tin (Sn), antimony (Sb), or a combination thereof.

5. The method of claim 1, comprising:
forming the second shell on the second one of the uncovered second layers, the second shell and the second one of the uncovered second layers forming the second channel structure of the second one of the transistors,
wherein the first channel structure is the P-type channel structure, and the second channel structure is the N-type channel structure.

6. The method of claim 1, comprising:
forming the second shell on the second one of the uncovered second layers, the second shell and the second one of the uncovered second layers forming the portion of the second channel structure of the second one of the transistors,
wherein the first and second shells include different materials.

7. The method of claim 1, wherein providing a vertical stack of alternating horizontal first and second layers includes epitaxially growing alternating horizontal first and second layers.

8. A method of fabricating a semiconductor device including a plurality of vertically stacked transistors, comprising:
providing a vertical stack of alternating horizontal first and second layers, the second layers forming channels of the transistors;
uncovering the second layers; and
forming a first shell on a first one of the uncovered second layers, the first shell and the first one of the uncovered second layers forming a first channel structure of a first one of the transistors,
wherein providing a vertical stack of alternating horizontal first and second layers includes bonding two substacks of alternating horizontal first and second layers.

9. The method of claim 1, wherein uncovering the second layers includes:
removing an end portion of the first layers in a channel direction to form indents;
forming spacers to fill the indents; and
removing a remainder of the first layers.

10. The method of claim 1, wherein forming a first shell on a first one of the uncovered second layers includes forming a first shell around a first one of the uncovered second layers.

11. The method of claim 1, further comprising forming a gate electrode around the first shell and a remainder of the second layers.

12. The method of claim 1, further comprising, prior to forming a first shell on a first one of the uncovered second layers, thinning a first one of the uncovered second layers,
wherein forming a first shell on a first one of the uncovered second layers includes forming a first shell on the thinned first one of the uncover second layers.

13. A semiconductor device, comprising:
a vertical stack of horizontal channels of a plurality of transistors;
a first shell formed on a first one of the channels, the first shell and the first one of the channels forming a first channel structure of a first one of the transistors; and
a second shell formed on a second one of the channels, the second shell and the second one of the channels forming a second channel structure of a second one of the transistors, wherein the first channel structure is a P-type channel structure, and the second channel structure is an N-type channel structure, or
a second shell formed on a second one of the channels, the second shell and the second one of the channels forming a second channel structure of a second one of the transistors, wherein the first and second shells include different materials.

14. The semiconductor device of claim 13, wherein the first shell includes an epitaxy material.

15. The semiconductor device of claim 14, wherein at least one of the first shell and the channels includes an element selected from groups III, IV and V of the periodic table.

16. The semiconductor device of claim 15, wherein at least one of the first shell and the channels includes B, C, N, Al, Si, P, Ga, Ge, As, In, Sn, Sb, or a combination thereof.

17. The semiconductor device of claim 13, comprising:
the second shell formed on the second one of the channels, the second shell and the second one of the channels forming the second channel structure of the second one of the transistors,
wherein the first channel structure is the P-type channel structure, and the second channel structure is the N-type channel structure.

18. The semiconductor device of claim 13, comprising:
the second shell formed on the second one of the channels, the second shell and the second one of the channels forming the second channel structure of the second one of the transistors,
wherein the first and second shells include different materials.

19. The semiconductor device of claim 13, wherein the first shell is formed around the first one of the channels.

20. The semiconductor device of claim 13, comprising:
a gate electrode formed around the first shell and a remainder of the channels.

* * * * *

UNITED STATES PATENT AND TRADEMARK OFFICE
CERTIFICATE OF CORRECTION

| | | |
|---|---|---|
| PATENT NO. | : 12,002,809 B2 | Page 1 of 1 |
| APPLICATION NO. | : 17/469939 | |
| DATED | : June 4, 2024 | |
| INVENTOR(S) | : Gardner et al. | |

It is certified that error appears in the above-identified patent and that said Letters Patent is hereby corrected as shown below:

In the Claims

In Column 14, Claim 20, Line 50, before "comprising:" insert --further--.

Signed and Sealed this
Seventeenth Day of September, 2024

*Katherine Kelly Vidal*

Katherine Kelly Vidal
*Director of the United States Patent and Trademark Office*